United States Patent
Nakajima

(10) Patent No.: US 8,040,263 B2
(45) Date of Patent: Oct. 18, 2011

(54) ANALOG-TO-DIGITAL CONVERTER WITH A CALIBRATION FUNCTION

(75) Inventor: Yuji Nakajima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 197 days.

(21) Appl. No.: 12/497,921

(22) Filed: Jul. 6, 2009

(65) Prior Publication Data
US 2010/0001888 A1    Jan. 7, 2010

(30) Foreign Application Priority Data

Jul. 3, 2008  (JP) .................. 2008-174634
Apr. 15, 2009  (JP) .................. 2009-098874

(51) Int. Cl.
*H03M 1/06* (2006.01)
(52) U.S. Cl. .......... 341/118; 341/120; 341/159
(58) Field of Classification Search .......... 341/118, 341/120, 159
See application file for complete search history.

(56) References Cited

U.S. PATENT DOCUMENTS

| | | | |
|---|---|---|---|
| 6,226,562 B1 * | 5/2001 | Philpott | 700/117 |
| 7,046,179 B1 | 5/2006 | Taft et al. | |
| 7,312,734 B2 * | 12/2007 | McNeill et al. | 341/120 |
| 7,535,390 B2 * | 5/2009 | Hsu | 341/118 |

FOREIGN PATENT DOCUMENTS

JP    2008-054205    3/2008

* cited by examiner

*Primary Examiner* — Khai M Nguyen
(74) *Attorney, Agent, or Firm* — Young & Thompson

(57) ABSTRACT

An analog-to-digital converter includes a reference voltage generator that outputs a reference voltage, a first comparator and a second comparator that compare the reference voltage and a voltage of an input signal and output a digital signal having a first logical value or a second logical value, and a calibrator that compares an output of the first comparator and an output of the second comparator and outputs a first offset control signal and a second offset control signal. The first comparator sets an offset value having a positive or negative polarity to an output inversion threshold level based on the first offset control signal, and the second comparator sets an offset value having a polarity opposite to the polarity set by the first comparator to an output inversion threshold level based on the second offset control signal.

22 Claims, 18 Drawing Sheets

ANALOG-TO-DIGITAL CONVERTER WITH A CALIBRATION FUNCTION

BACKGROUND

1. Field of the Invention

The present invention relates to an analog-to-digital converter and, particularly, to an analog-to-digital converter having a calibration function of a comparator that converts an analog value to a digital value.

2. Description of Related Art

In the signal processing field, signal processing based on digital signals has become mainstream today. Thus, if an externally input signal is a signal having an analog value (which is referred to hereinafter as an analog signal), the analog signal is converted to a digital signal and processed. One of circuits that perform such conversion processing is an analog-to-digital converter. The analog-to-digital converter includes a comparator that compares the value of an input analog signal with the value of a reference signal and converts the analog signal to a digital signal. The comparator, however, generally has an offset. Due to the offset, in the comparator, a threshold for inverting the logic level of an output signal is deviated from the voltage value of a reference voltage. In order to perform analog-to-digital conversion with high accuracy, it is necessary to reduce the deviation of the threshold. One approach to eliminate the threshold deviation is to reduce the threshold deviation of the comparator by calibration processing.

An example of a technique of performing such calibration processing is disclosed in U.S. Pat. No. 7,046,179. FIG. 20 is a block diagram showing an analog-to-digital converter 100 disclosed in U.S. Pat. No. 7,046,179. The analog-to-digital converter 100 shown in FIG. 20 includes a calibration reference voltage generator 130, a selector 145, a sample-and-hold circuit 160, conversion circuits 121 and 122 and a control circuit 140. During a calibration period, the analog-to-digital converter 100 performs calibration of the converter 100 by using a calibration reference voltage CALREF that is generated in the calibration reference voltage generator 130. The analog-to-digital converter 100 can thereby correct an error of the converter 100 and improve the conversion accuracy.

Japanese Unexamined Patent Publication No. 2008-54205 discloses an example of an analog-to-digital converter that improves the conversion accuracy without performing the calibration processing.

SUMMARY

In the analog-to-digital converter 100 disclosed in U.S. Pat. No. 7,046,179, it is necessary to set a calibration period in addition to normal operation in order to perform the calibration processing. However, the conversion accuracy of the analog-to-digital converter varies according to a change in operating environments such as a change in power supply voltage and a change in temperature of a semiconductor device. Therefore, it is necessary to set a calibration period appropriately according to the operating environments in order to maintain the conversion accuracy in the analog-to-digital converter 100. Thus, the analog-to-digital converter 100 has a problem that, if analog-to-digital conversion is performed continuously, it is unable to respond to a change in operating environments, thus failing to maintain the conversion accuracy.

A first exemplary aspect of an embodiment of the present invention is an analog-to-digital converter that includes a reference voltage generator that outputs a reference voltage, a first comparator and a second comparator that compare the reference voltage and a voltage of an input signal and output a digital signal having a first logical value or a second logical value, and a calibrator that compares an output of the first comparator and an output of the second comparator and outputs a first offset control signal and a second offset control signal, wherein the first comparator sets an offset value having a positive or negative polarity to an output inversion threshold level based on the first offset control signal, and the second comparator sets an offset value having a polarity opposite to the polarity set by the first comparator to an output inversion threshold level based on the second offset control signal.

A second exemplary aspect of an embodiment of the present invention is an analog-to-digital converter that includes an input terminal that inputs an input signal, a first reference voltage input terminal and a second reference voltage input terminal that input reference voltages having the same voltage value, a first comparator that compares the reference voltage input from the first reference voltage input terminal and a voltage of the input signal and outputs a digital signal having a first logical value or a second logical value, a second comparator that compares the reference voltage input from the second reference voltage input terminal and a voltage of the input signal and outputs a digital signal having a first logical value or a second logical value, a first counter that is placed corresponding to the first comparator, a second counter that is placed corresponding to the second comparator, and a calibrator that compares an output of the first comparator and an output of the second comparator and outputs a first offset control signal and a second offset control signal having polarities opposite to each other, wherein the first counter increases or decreases a value of a first adjustment factor based on a polarity of the first offset control signal, the first comparator sets an offset value of an output inversion threshold level based on a value of the first adjustment factor, the second counter increases or decreases a value of a second adjustment factor based on a polarity of the second offset control signal, and the second comparator sets an offset value of an output inversion threshold level based on a value of the second adjustment factor.

In the analog-to-digital converter according to the exemplary aspects of an embodiment of the present invention, an analog signal is converted to a digital signal by the first and second comparators that receive the reference voltages having the same voltage value and the same input signal and output the digital signal. In the analog-to-digital converter according to the exemplary aspects of an embodiment of the present invention, the calibrator operates concurrently with the conversion processing and performs the calibration processing of the first and second comparators by outputting the first and second offset control signals for setting the offset value of the output inversion threshold level of the first and second comparators. Accordingly, the analog-to-digital converter according to the exemplary aspects of an embodiment of the present invention is capable of performing the conversion processing and the calibration processing concurrently.

In the analog-to-digital converter according to the exemplary aspects of an embodiment of the present invention, it is possible to perform the analog-to-digital conversion processing and the calibration processing of the comparators concurrently.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Exemplary embodiments of the present invention are described hereinafter with reference to the appended drawings. In the followings, analog-to-digital converters according to exemplary embodiments are described by taking an analog-to-digital converter having a resolution of given bits as an example. In the following description, n is an integer, and a numeric character added at the end of a reference symbol designating an element indicates a bit value of conversion processing to be handled by the element. Further, in the following description, x is used as a value indicating any of 1 to n+1. If there is no particular need to specify a corresponding bit value, a numeric character indicating a bit value is not added to a reference symbol of an element in the following description.

Figure 1:
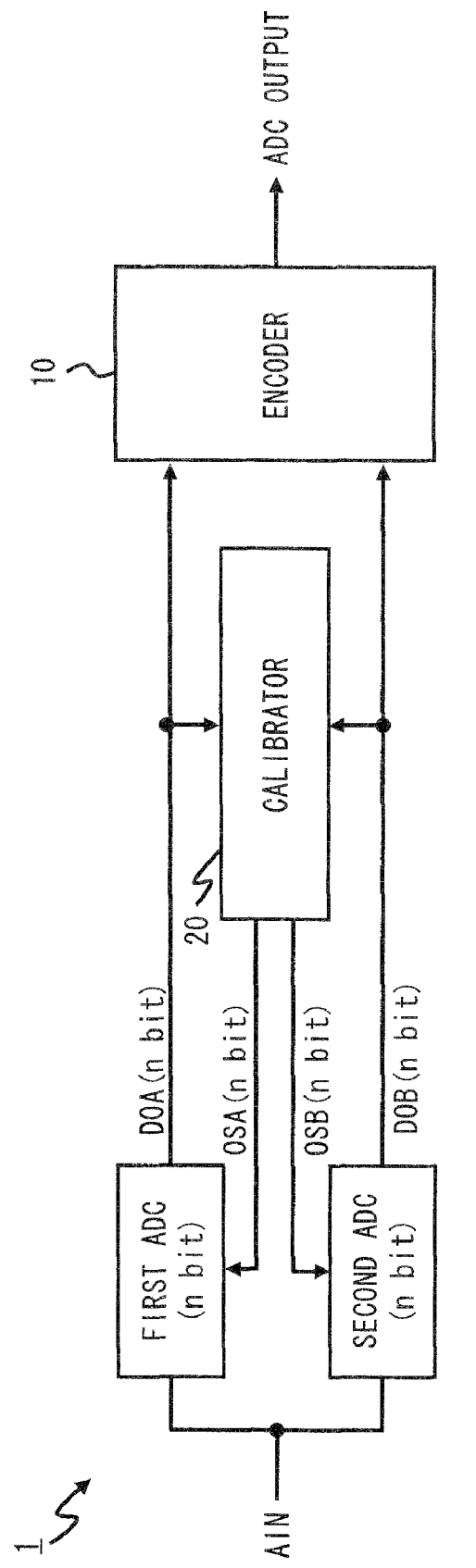
FIG. 1 is a block diagram showing an analog-to-digital converter according to a first exemplary embodiment of the present invention.
Figure 2:
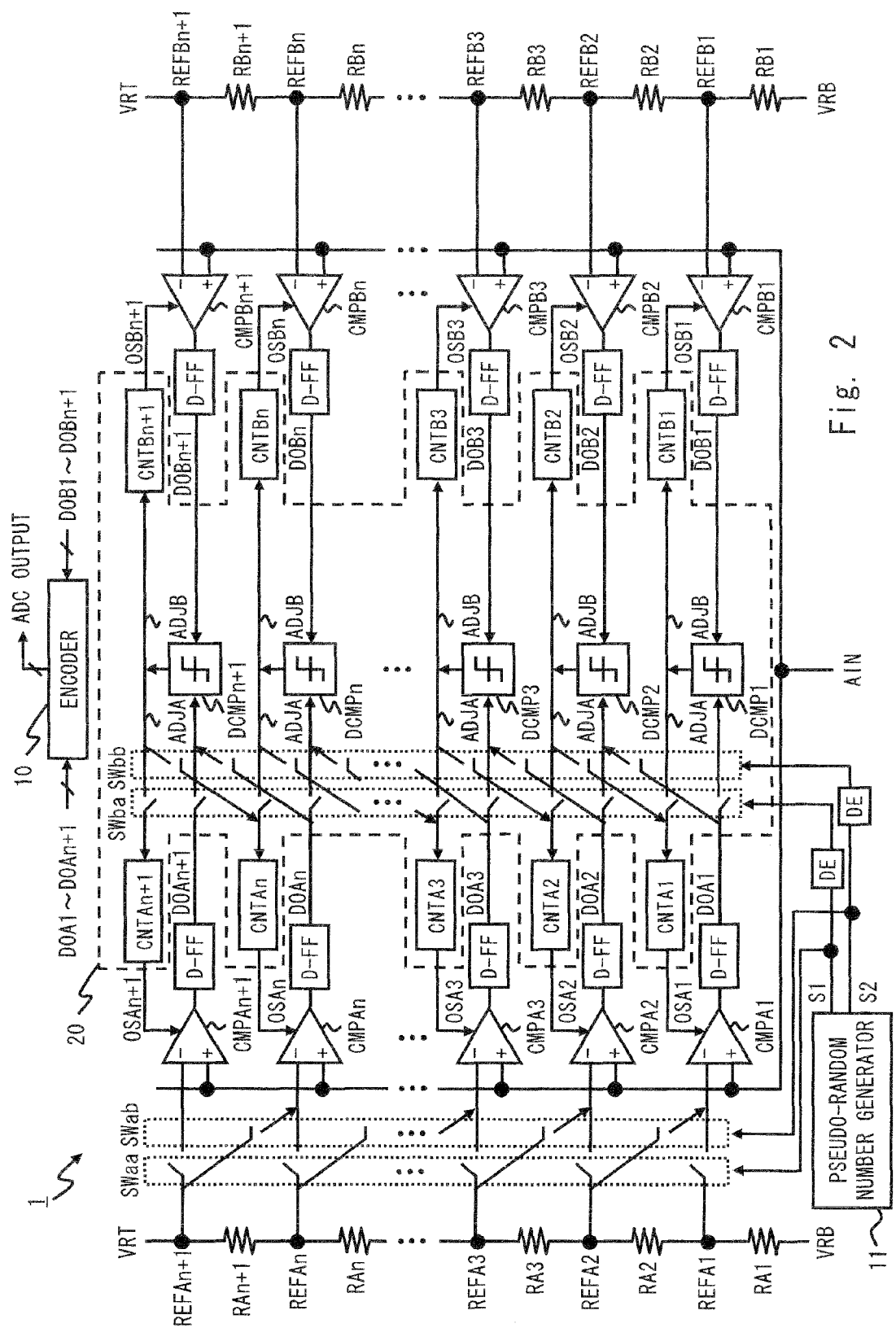
FIG. 2 is a detailed block diagram showing the analog-to-digital converter according to the first exemplary embodiment.

FIG. 1 is a block diagram showing an analog-to-digital converter 1 according to an exemplary embodiment of the present invention. Referring to FIG. 1, the analog-to-digital converter 1 includes a first analog-to-digital conversion circuit (ADC), a second analog-to-digital conversion circuit, a calibrator 20, and an encoder 10. In this exemplary embodiment, a flash type analog-to-digital conversion circuit that converts an analog value to a digital value with use of a plurality of comparators and outputs the digital value as a thermometer code is used as the first and second analog-to-digital conversion circuits. FIG. 2 is a detailed block diagram showing the analog-to-digital converter 1 shown in FIG. 1.

Referring to FIG. 2, the analog-to-digital converter 1 includes a plurality of comparators CMPA and a reference voltage generator that generates a reference voltage REFA as the first analog-to-digital conversion circuit and includes a plurality of comparators CMPB and a reference voltage generator that generates a reference voltage REFB as the second analog-to-digital conversion circuit. Further, the calibrator 20 of the analog-to-digital converter 1 at least includes a digital comparator DCMP. Although the calibrator 20 includes the digital comparator DCMP and a counter CNTA and a counter CNTB that increase or decrease an adjustment factor according to a signal output from the digital comparator DCMP in the first exemplary embodiment, the counters CNTA and CNTB may be implemented as a part of the comparators CMPA and CMPB, respectively. In other exemplary embodiments described later also, it is assumed that the calibrator 20 includes the digital comparator DCMP and the counters CNTA and CNTB, though not particularly described. Further, although a switching circuit, which is described later, is included in FIG. 1, the switching circuit may belong to any of the calibrator 20, the comparator CMPA and the comparator CMPB.

In the analog-to-digital converter 1, a 1-bit converter is made up of one first comparator CMPA, one second comparator CMPB and one calibrator (e.g. the digital comparator DCMP). In this exemplary embodiment, $2^N+1$ (which is referred to as n+1 in the following description) number of converters are used to form an N-bit analog-to-digital converter. Accordingly, the analog-to-digital converter 1 includes first comparators CMPA1 to CMPAn+1, second comparators CMPB1 to CMPBn+1, and digital comparators DCMP1 to DCMPn+1. Further, first counters CNTA1 to CNTAn+1 are placed corresponding respectively to the first comparators CMPA1 to CMPAn+1, and second counters CNTB1 to CNTBn+1 are placed corresponding respectively to the second comparators CMPB1 to CMPBn+1. Furthermore, latch circuits D-FF that hold an output value for a given period of time are connected respectively to the outputs of the first comparators CMPA1 to CMPAn+1 and the outputs of the second comparators CMPB1 to CMPBn+1.

Further, the analog-to-digital converter 1 includes reference voltage generators. In the example shown in FIG. 2, the reference voltage generators are separately placed corresponding respectively to the first comparators CMPA and the second comparators CMPB. The respective reference voltage generators include n+1 number of resistors (resistors RA1 to RAn+1 and resistors RB1 to RBn+1 shown in FIG. 2) that are connected in series between a positive constant voltage VRT and a negative constant voltage VRB. Each reference voltage generator outputs a plurality of reference voltages generated by dividing the positive constant voltage VRT and the negative constant voltage VRB with use of the resistors. In the example shown in FIG. 2, the reference voltage generator placed corresponding to the first comparators CMPA outputs reference voltages REFA1 to REFAn+1, and the reference voltage generator placed corresponding to the second comparators CMPB outputs reference voltages REFB1 to REFBn+1. The reference voltage generator placed corresponding to the first comparators CMPA and the reference voltage generator placed corresponding to the second comparators CMPB have the same resistance divider ratio. In this exemplary embodiment, the reference voltages designated by the reference symbols with the same numeric character added at the end have the same voltage value. For example, the reference voltage REFA1 and the reference voltage REFB1 have the same voltage value. The reference voltage generator may be a single circuit that is shared by the first comparators and the second comparators.

The analog-to-digital converter 1 further includes a first switching circuit (which is referred to hereinafter as a first barrel shift network) and a second switching circuit (which is referred to hereinafter as a second barrel shift network). The first barrel shift network is composed of a switching circuit SWaa and a switching circuit SWab. The second barrel shift network is composed of a switching circuit SWba and a switching circuit SWbb. The first barrel shift network is placed between the reference voltage generator and the first comparators CMPA. The second barrel shift network is placed between the first comparators CMPA and the digital comparators DCMP.

The opening and closing of the switching circuit SWaa and the switching circuit SWba are controlled based on a switch control signal S1. The opening and closing of the switching circuit SWab and the switching circuit SWbb are controlled based on a switch control signal S2. The switch control signals S1 and S2 are output from a pseudo-random number generator 11, and they have logical values that are inverted from each other. The switching circuits SWaa and SWba and the switching circuits SWab and SWbb are thereby controlled exclusively from each other. The switch control signals S1 and S2 are generated by the pseudo-random number generator 11, so that their values randomly change.

The first barrel shift network switches between one comparator and another comparator included in the first comparators CMPA to which one of a plurality of reference voltages is to be supplied. In this exemplary embodiment, the switching circuit SWaa is placed between the x-th bit reference voltage value REFAx and the x-th bit first comparator CMPAx. On the other hand, the switching circuit SWab is placed between the x-th bit reference voltage value REFAx and the x−1th bit first comparator CMPAx−1.

The second barrel shift network switches between one first comparator and another first comparator of a plurality of first comparators CMPA which is to be connected to one digital comparator DCMP. In this exemplary embodiment, the switching circuit SWba is placed between the x-th bit first comparator CMPAx and the x-th bit digital comparator DCMPx. On the other hand, the switching circuit SWbb is placed between the x−1th bit first comparator CMPAx−1 and the x-th bit digital comparator DCMPx. The connection states of the first barrel shift network and the second barrel shift network are controlled by the switch control signals S1 and S2. The switch control signals S1 and S2 to be input to the second barrel shift network are input through a delay circuit DE. Thus, the timing when the connection state of the second barrel shift network switches delays behind the timing when the connection state of the first barrel shift network switches. For example, if an operation clock of the comparators or the like is used as a reference, the switch timing of the second barrel shift network is one clock after the switch timing of the first barrel shift network.

The first comparators CMPA, the second comparators CMPB, the digital comparators DCMP, the first counters CNTA and the second counters CNTB are described hereinafter in further detail.

The first comparators CMPA receive an input signal AIN that is input from an input terminal through its non-inverting terminal and receive a reference voltage that is input via the first barrel shift network through its reference voltage input terminal (e.g. inverting terminal). The input signal AIN is a signal having an analog value. The first comparators CMPA use the reference voltage as an output inversion threshold level. If the voltage of the input signal is higher than the reference voltage, the first comparators CMPA output a first logical value (e.g. high level). If the voltage of the input signal is lower than the reference voltage, the first comparators CMPA output a second logical value (e.g. low level).

The second comparators CMPB receive the input signal AIN that is input from the input terminal through its non-inverting terminal and receive the reference voltage through its reference voltage input terminal (e.g. inverting terminal). The second comparators CMPB use the reference voltage as an output inversion threshold level. If the voltage of the input signal is higher than the reference voltage, the second comparators CMPB output high level. If the voltage of the input signal is lower than the reference voltage, the second comparators CMPB output low level.

The first comparators CMPA have an offset voltage OFFA, and the second comparators CMPB have an offset voltage OFFB. Therefore, the first comparators CMPA and the second comparators CMPB use the sum of the input reference voltage and the offset voltage as an actual output inversion threshold level. A clock signal (not shown) is input to the first comparators CMPA and the second comparators CMPB, and the first comparators CMPA and the second comparators CMPB perform the comparison operation of the input signal in synchronization with the clock signal.

The latch circuits D-FF are placed corresponding to the respective outputs of the first comparators CMPA and the second comparators CMPB. In this exemplary embodiment, a D-type flip-flop is used as the latch circuit D-FF. The D-type flip-flop latches the input signal in synchronization with the clock signal (not shown) and outputs the latched value until the next clock signal is input. Outputs DOA1 to DOAn+1 of the latch circuits D-FF that are placed corresponding to the first comparators CMPA correspond to the outputs of the first comparators CMPA1 to CMPAn+1, and outputs DOB1 to DOBn+1 of the latch circuits D-FF that are placed corresponding to the second comparators CMPB correspond to the outputs of the second comparators CMPB1 to CMPBn+1. In this exemplary embodiment, if the voltage value of the input signal increases, the values of the outputs DOA1 to DOAn+1 and the outputs DOB1 to DOBn+1 become 1 (e.g. high level) from the lower-order bit. Thus, in this exemplary embodiment, the value indicated by the outputs DOA1 to DOAn+1 or the outputs DOB1 to DOBn+1 is referred to as a thermometer code. The analog-to-digital converter 1 according to the exemplary embodiment includes the encoder 10 that encodes the thermometer code.

The digital comparators DCMP compare the output of the first comparators CMPA and the output of the second comparators CMPB and then outputs a first offset control signal ADJA and a second offset control signal ADJB. The first offset control signal ADJA is a control signal corresponding to the first comparators CMPA, and the second offset control signal ADJB is a control signal corresponding to the second comparators CMPB. The first offset control signal ADJA and the second offset control signal ADJB have a positive or negative polarity when it is necessary to increase or decrease the offset value of the first comparators CMPA and the second comparators CMPB. On the other hand, the first offset control signal ADJA and the second offset control signal ADJB have no polarity when it is not necessary to increase or decrease the offset value of the first comparators CMPA and the second comparators CMPB. The polarity of the first offset control signal ADJA and the second offset control signal ADJB indicates whether the offset value of the first comparators CMPA and the second comparators CMPB is to increase or decrease.

Specifically, if the output of the first comparators CMPA and the output of the second comparators CMPB have different logical values, the digital comparators DCMP output the first offset control signal ADJA and the second offset control signal ADJB that have a polarity. The offset control signal for the comparators that output high level has a negative polarity, and the offset control signal for the comparators that output low level has a positive polarity. On the other hand, if the output of the first comparators CMPA and the output of the second comparators CMPB have the same logical value, the first offset control signal ADJA and the second offset control signal ADJB both have no polarity.

The first counters CNTA receive the first offset control signal ADJA and increase or decrease a first adjustment factor OSA. Specifically, if the first offset control signal ADJA has a positive polarity, the first adjustment factor OSA becomes larger, and if the first offset control signal ADJA has a negative polarity, the first adjustment factor OSA becomes smaller. On the other hand, if the first offset control signal ADJA has no polarity, the first counters CNTA maintain the current value of the first adjustment factor OSA.

The first adjustment factor OSA that is output from the first counters CNTA is supplied to the first comparators CMPA. The first comparators CMPA have an offset adjustment function that changes the output inversion threshold level in units of step of a predetermined adjustment step CALA. The first comparators CMPA change the output inversion threshold level according to the offset value that is determined based on the adjustment step CALA and the first adjustment factor OSA. In this exemplary embodiment, the offset value is determined by the product of the adjustment step CALA and the first adjustment factor OSA. Thus, the first comparators CMPA set a positive or negative offset value to the output inversion threshold level based on the first offset control signal ADJA.

The second counters CNTB receive the second offset control signal ADJB and increase or decrease a second adjustment factor OSB. Specifically, if the second offset control signal ADJB has a positive polarity, the second adjustment factor OSB becomes larger, and if the second offset control signal ADJB has a negative polarity, the second adjustment factor OSB becomes smaller. On the other hand, if the second offset control signal ADJB has no polarity, the second counters CNTB maintain the current value of the second adjustment factor The second adjustment factor OSB that is output from the second counters CNTB is supplied to the second comparators CMPB. The second comparators CMPB have an offset adjustment function that changes the output inversion threshold level in units of step of a predetermined adjustment step CALB. The second comparators CMPB change the output inversion threshold level according to the offset value that is determined based on the adjustment step CALB and the second adjustment factor OSB. In this exemplary embodiment, the offset value is determined by the product of the adjustment step CALB and the second adjustment factor OSB. Thus, the second comparators CMPB set a positive or negative offset value to the output inversion threshold level based on the second offset control signal ADJB.

Figure 3:
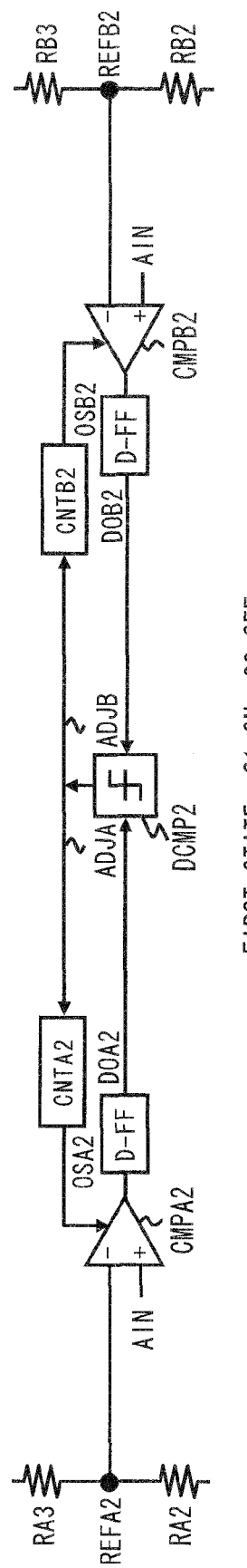
FIG. 3 is a view showing a first state of a configuration pattern of a 1-bit converter in the analog-to-digital converter according to the first exemplary embodiment.
Figure 4:
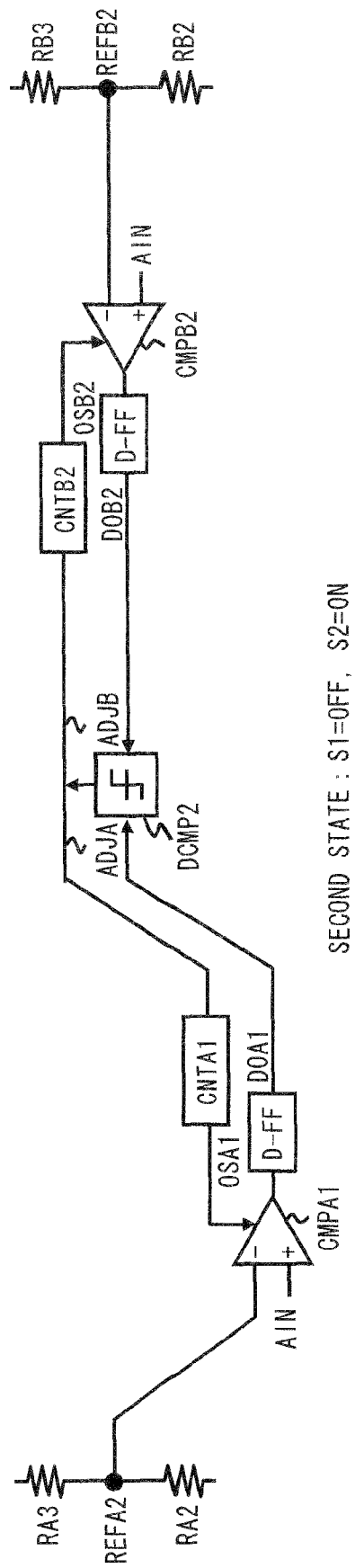
FIG. 4 is a view showing a second state of a configuration pattern of a 1-bit converter in the analog-to-digital converter according to the first exemplary embodiment.

The analog-to-digital converter 1 according to the exemplary embodiment switches the comparators to form a 1-bit converter according to the connection state of the first barrel shift network and the second barrel shift network. FIGS. 3 and 4 show the configurations of a 1-bit converter in the analog-to-digital converter 1. In the examples shown in FIGS. 3 and 4, the first comparator CMPA and the second comparator CMPB that are connected to the 2nd bit digital comparator DCMP2 are illustrated.

The example of FIG. 3 shows the configuration of a 1-bit converter in a first state where the switch control signal S1 is in the on (closed) state and the switch control signal S2 is in the off (opened) state. In the first state, the switching circuit SWaa and the switching circuit SWba are in the on state, and the switching circuit SWab and the switching circuit SWbb are in the off state. Accordingly, the first comparator CMPA2 and the second comparator CMPB2 are connected to the digital comparator DCMP2. Further, the reference voltage REFA2 is supplied to the inverting terminal of the first comparator CMPA2. The reference voltage REFB2 is supplied to the inverting terminal of the second comparator CMPB2.

Further, in the first state, the first offset control signal ADJA that is output from the digital comparator DCMP2 is supplied to the first counter CNTA2, and the second offset control signal ADJB is supplied to the second counter CNTB2. Then, the first adjustment factor OSA2 is supplied from the first counter CNTA2 to the first comparator CMPA2. The second adjustment factor OSB2 is supplied from the second counter CNTB2 to the second comparator CMPB2.

The example of FIG. 4 shows the configuration of a 1-bit converter in a second state where the switch control signal S1 is in the off (opened) state, and the switch control signal S2 is in the on (closed) state. In the second state, the switching circuit SWaa and the switching circuit SWba are in the off state, and the switching circuit SWab and the switching circuit SWbb are in the on state. Accordingly, the first comparator CMPA1 and the second comparator CMPB2 are connected to the digital comparator DCMP2. Further, the reference voltage REFA2 is supplied to the inverting terminal of the first comparator CMPA1. The reference voltage REFB2 is supplied to the inverting terminal of the second comparator CMPB2.

Further, in the second state, the first offset control signal ADJA that is output from the digital comparator DCMP2 is supplied to the first counter CNTA1, and the second offset control signal ADJB is supplied to the second counter CNTB2. Then, the first adjustment factor OSA1 is supplied from the first counter CNTA1 to the first comparator CMPA1. The second adjustment factor OSB2 is supplied from the second counter CNTB2 to the second comparator CMPB2.

Figure 5:
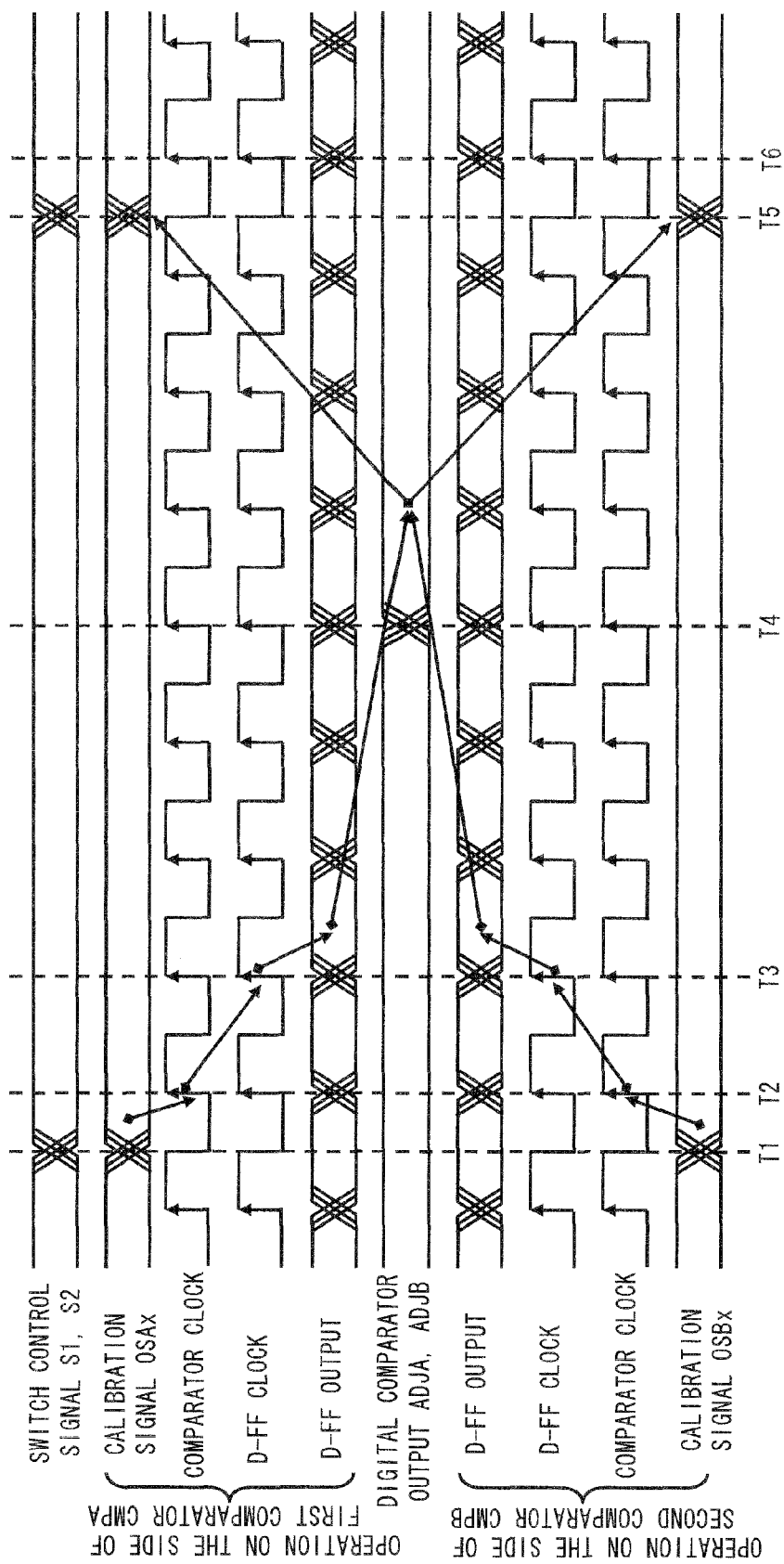
FIG. 5 is a timing chart showing an operation in the analog-to-digital converter according to the first exemplary embodiment.

As described above, the analog-to-digital converter 1 forms the converter of two different connection states by the first and second barrel shift networks. The analog-to-digital converter 1 performs the same conversion operation and calibration operation in any connection state. FIG. 5 is a timing chart showing the operation of the analog-to-digital converter 1.

Referring to FIG. 5, the values of the switch control signals S1 and S2 change at the timing T1, and the connection state of the analog-to-digital converter 1 becomes the first state or the second state. Further, the values of the first adjustment factor OSA and the second adjustment factor OSB are updated at the timing T1. By the update processing, the first comparators CMPA and the second comparators CMPB update the output inversion threshold level.

Next, in synchronization with the rising edge of a clock signal for comparators at the timing T2, the first comparators CMPA and the second comparators CMPB perform comparison between the voltage of the input signal AIN and the reference voltage based on the updated output inversion threshold level. Then, in synchronization with the rising edge of a clock signal for D-FF at the timing T3, the latch circuits D-FF latch the value of the corresponding comparator and outputs the latched value.

After that, at the timing T4, the digital comparators DCMP compare the output of the first comparators CMPA and the output of the second comparators CMPB that are supplied via the latch circuits D-FF and then newly output the first offset control signal ADJA and the second offset control signal ADJB. The values of the first offset control signal ADJA and the second offset control signal ADJB that are updated at the timing T4 are supplied to the first counters CNTA and the second counters CNTB, respectively. Then, at the timing T5, the first counters CNTA and the second counters CNTB update the first adjustment factor OSA and the second adjustment factor OSB, respectively.

In the analog-to-digital converter 1, the timings T1 to T5 are one cycle of calibration processing. Further, in the analog-to-digital converter 1, the clock for comparators and the clock for D-FF are clock signals that have the same frequency and are synchronized with each other. In the analog-to-digital converter 1, one cycle of the clock for comparators or the clock for D-FF is one cycle of the conversion processing. As shown in FIG. 5, in the analog-to-digital converter 1, the conversion processing of the input signal from an analog value to a digital value and the calibration processing of the comparator are executed concurrently.

The calibration processing in the analog-to-digital converter 1 is described hereinafter in detail. The first comparators CMPA and the second comparators CMPB that are used in the analog-to-digital converter 1 have the offset adjustment function as described above. The adjustment step CALA and CALB of the output inversion threshold level in the first comparators CMPA and the second comparators CMPB have a smaller value than the range of the resolution (1LSB) of the analog-to-digital converter 1. In the followings, the calibration processing of the output inversion threshold level is described by representing one unit of the adjustment step CALA and CALB as $\Delta$, an offset voltage of the first comparators CMPA as OFFA, and an offset voltage of the second comparators CMPB as OFFB.

Figure 6:
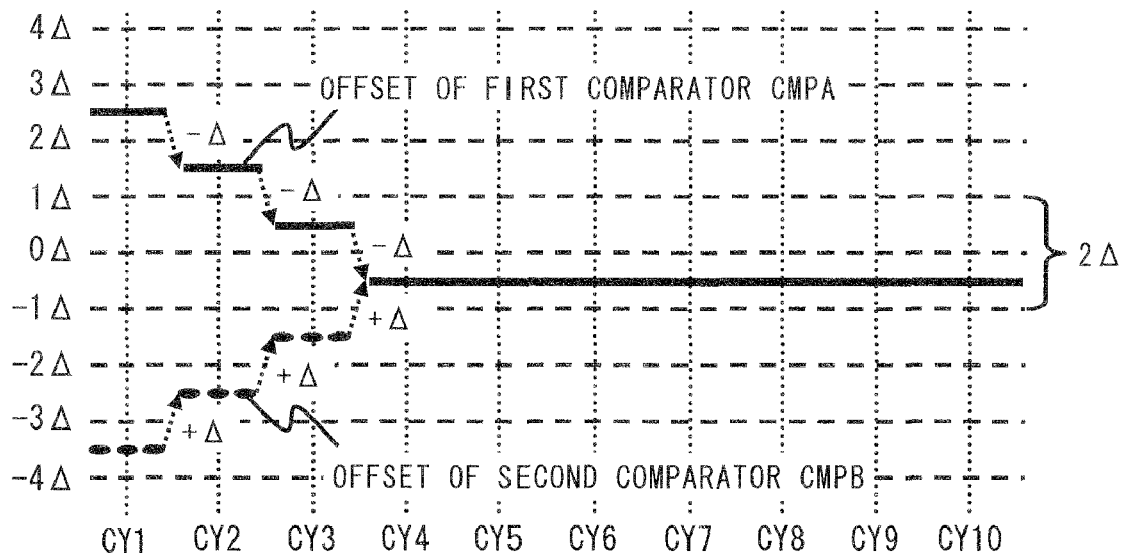
FIG. 6 is a timing chart showing an operation of calibration processing in the analog-to-digital converter according to the first exemplary embodiment.

FIG. 6 is a timing chart of the calibration processing in the case where a difference between the offset voltage OFFA of the first comparators CMPA and the offset voltage OFFB of the second comparators CMPB is 6$\Delta$. In the timing chart shown in FIG. 6, the horizontal axis indicates the cycle number CY of the calibration processing, and the vertical axis indicates the value of the offset. In the example shown in FIG. 6, the offset voltage OFFA of the first comparators CMPA has a positive offset value and the offset voltage OFFB of the second comparators CMPB has a negative offset value in the initial state. Then, the offset voltage OFFA of the first comparators CMPA decreases by 1$\Delta$ in each cycle of the calibration processing, and the offset voltage OFFB of the second comparators CMPB increases by 1$\Delta$ in each cycle of the calibration processing. In the fourth cycle CY4, the offset voltage OFFA and the offset voltage OFFB become the same. Specifically, a difference in offset voltage between the first comparators CMPA and the second comparators CMPB becomes zero in the calibration processing shown in FIG. 6.

Figure 7:
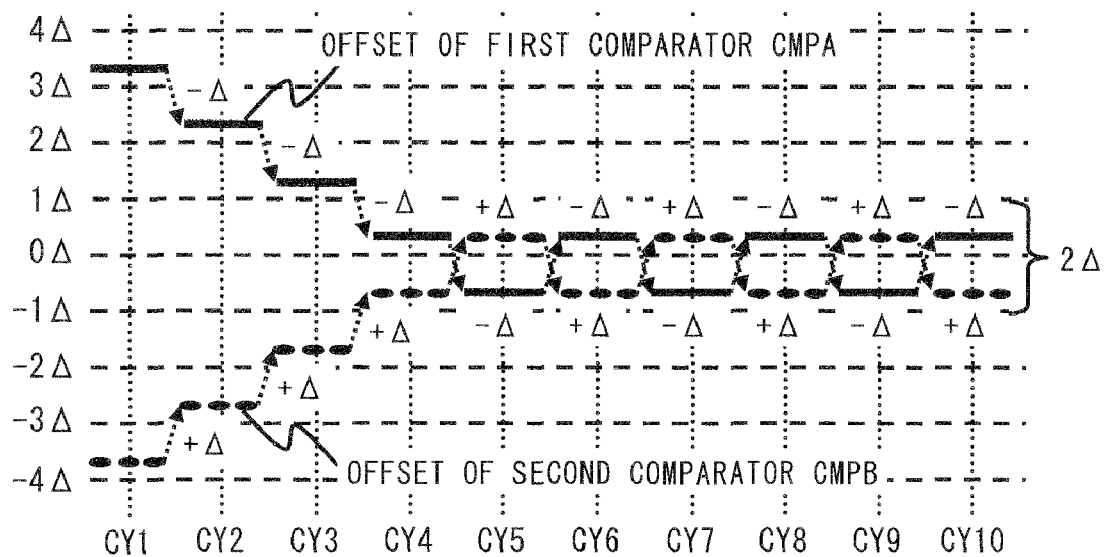
FIG. 7 is a timing chart showing an operation of calibration processing in the analog-to-digital converter according to the first exemplary embodiment.

FIG. 7 is a timing chart of the calibration processing in the case where a difference between the offset voltage OFFA of the first comparators CMPA and the offset voltage OFFB of the second comparators CMPB is 6.9$\Delta$. In the timing chart shown in FIG. 7, the horizontal axis indicates the cycle number CY of the calibration processing, and the vertical axis indicates the value of the offset. In the example shown in FIG. 7, the offset voltage OFFA of the first comparators CMPA has a positive offset value and the offset voltage OFFB of the second comparators CMPB has a negative offset value in the initial state. Then, the offset voltage OFFA of the first comparators CMPA decreases by 1$\Delta$ in each cycle of the calibration processing, and the offset voltage OFFB of the second comparators CMPB increases by 1$\Delta$ in each cycle of the calibration processing. However, after a difference between the offset voltage OFFA and the offset voltage OFFB becomes 0.9$\Delta$, the offset values are inverted from each other in the subsequent cycles of the calibration processing, and the difference becomes 1.1$\Delta$ in the next cycle of the calibration processing. Therefore, a difference in offset voltage between the first comparators CMPA and the second comparators CMPB can be 1.1$\Delta$ or smaller in the calibration processing shown in FIG. 7.

Figure 8:
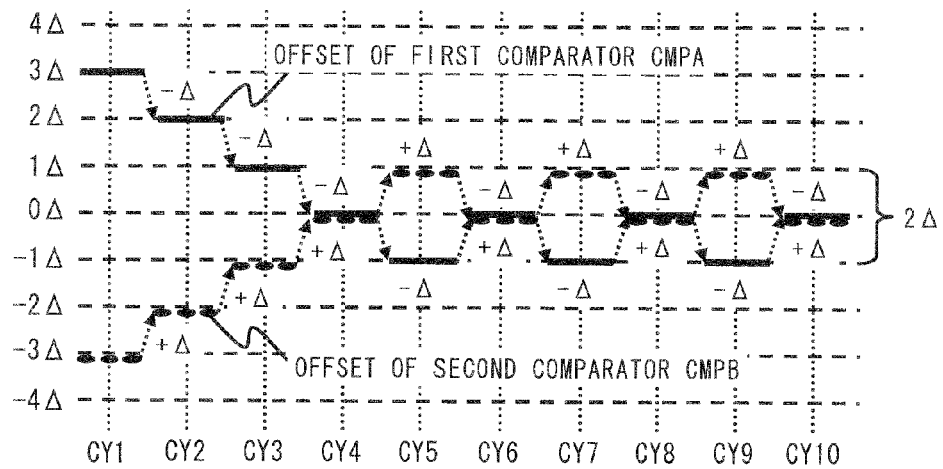
FIG. 8 is a timing chart showing an operation of calibration processing in the analog-to-digital converter according to the first exemplary embodiment.

FIG. 8 is a timing chart of the calibration processing in the case where a difference between the offset voltage OFFA of the first comparators CMPA and the offset voltage OFFB of the second comparators CMPB is 6.1$\Delta$. In the timing chart shown in FIG. 8, the horizontal axis indicates the cycle number CY of the calibration processing, and the vertical axis indicates the value of the offset. In the example shown in FIG. 8, the offset voltage OFFA of the first comparators CMPA has a positive offset value and the offset voltage OFFB of the second comparators CMPB has a negative offset value in the initial state. Then, the offset voltage OFFA of the first comparators CMPA decreases by 1$\Delta$ in each cycle of the calibration processing, and the offset voltage OFFB of the second comparators CMPB increases by 1$\Delta$ in each cycle of the calibration processing. However, after a difference between the offset voltage OFFA and the offset voltage OFFB becomes 0.1$\Delta$, the difference becomes 1.9$\Delta$ in the next cycle of the calibration processing. Therefore, a difference in offset voltage between the first comparators CMPA and the second comparators CMPB can be 1.9$\Delta$ or smaller in the calibration processing shown in FIG. 8.

The examples shown in FIGS. 6 to 8 are in the case where the switching of the configuration of the converter by the barrel shift networks is not performed. In such a case also, the calibration processing in the analog-to-digital converter 1 allows a difference between the offset voltage OFFA of the first comparators CMPA and the offset voltage OFFB of the second comparators CMPB to be smaller than 2$\Delta$ as shown in FIGS. 6 to 8.

However, in the case where the processing of switching the configuration of the converter by the barrel shift networks is not performed, the linearity between the voltage value of the input signal and the digital value of the output signal in the analog-to-digital converter 1 cannot be improved. This is because the mutual offset adjustment in the first comparators CMPA1 to CMPAn+1 and the mutual offset adjustment in the second comparators CMPB1 to CMPBn+1 are not performed in the case where the switching of the configuration of the converter by the barrel shift networks is not performed.

In light of this, the analog-to-digital converter 1 according to the exemplary embodiment performs the switching of the configuration of the converter by the barrel shift networks. Specifically, the configuration of the converter is set to the first state by the barrel shift networks, and the calibration processing is performed. The offset of the x-th first comparator CMPAx and the offset of the x-th second comparator CMPBx are thereby cancelled out. Next, the configuration of the converter is set to the second state by the barrel shift networks. The offset of the x−1th first comparator CMPAx−1 and the offset of the x-th second comparator CMPBx are thereby cancelled out. Because the value of the offset of the first comparator CMPAx affects the value of the offset of the second comparator CMPBx, the value of the offset of the first comparator CMPAx also affects the value of the offset of the first comparator CMPAx−1.

Then, the calibration processing is performed while switching the configuration of the converter between the first state and the second state by the barrel shift networks, so that the offset of the first comparator CMPAx−1 and the offset of the first comparator CMPAx are cancelled out. Accordingly, in the analog-to-digital converter 1, the offset between a plurality of first comparators is cancelled out via the second comparator, and the linearity between the voltage value of the input signal and the digital value of the output signal in the analog-to-digital converter 1 is thereby improved.

As described in the foregoing, the analog-to-digital converter 1 according to the exemplary embodiment includes the two comparators to which the same input signal and the reference voltages having the same voltage value are input and the digital comparator which compares the output values of the two comparators and controls the offset between the two comparators. The analog-to-digital converter 1 can thereby perform the calibration processing of the comparators concurrently with the conversion processing of the input signal into a digital value. Therefore, even if a change in operating environments such as a change in power supply voltage and a change in temperature of a semiconductor substrate occurs during the period of performing the conversion processing, the analog-to-digital converter 1 can execute the calibration processing without interrupting the conversion processing. It is thereby possible in the analog-to-digital converter 1 to improve the conversion accuracy without decreasing the processing capacity due to interruption of the conversion processing.

Further, the analog-to-digital converter 1 according to the exemplary embodiment can cancel out the offset between a plurality of first comparators by switching the configuration of the converter with use of the barrel shift networks. It is thereby possible to improve the linearity between the voltage value of the input signal and the digital value of the output signal in the analog-to-digital converter 1.

Figure 9:
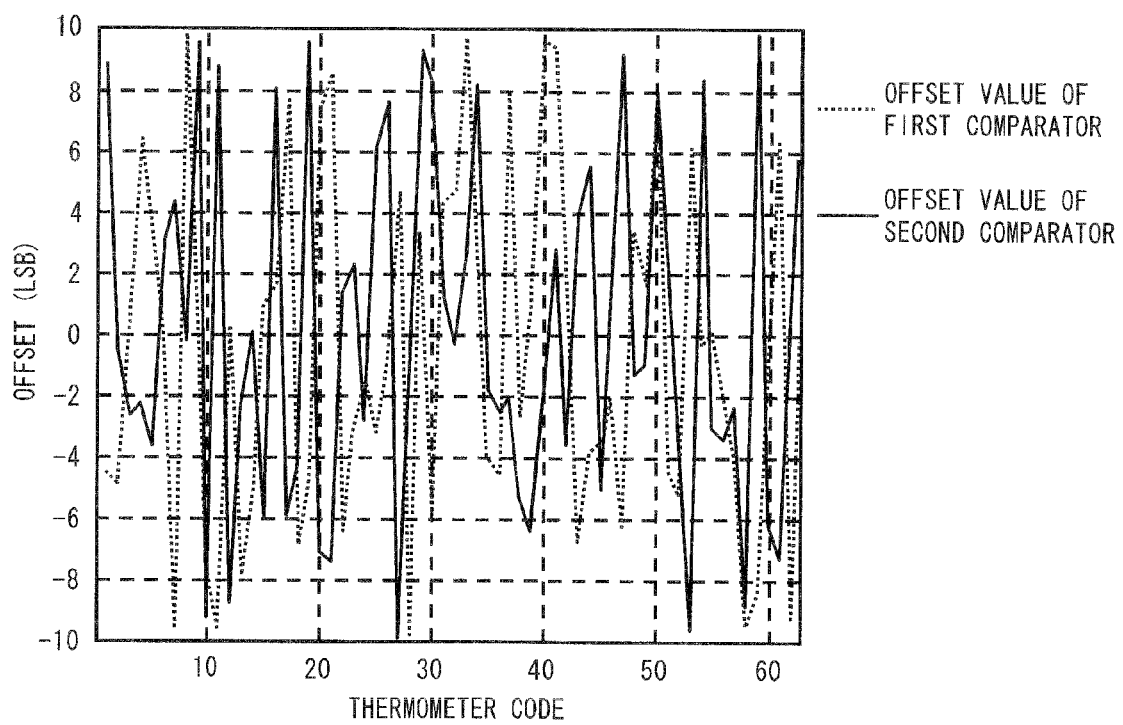
FIG. 9 is a graph showing an initial state of linearity of the analog-to-digital converter according to the first exemplary embodiment.
Figure 10:
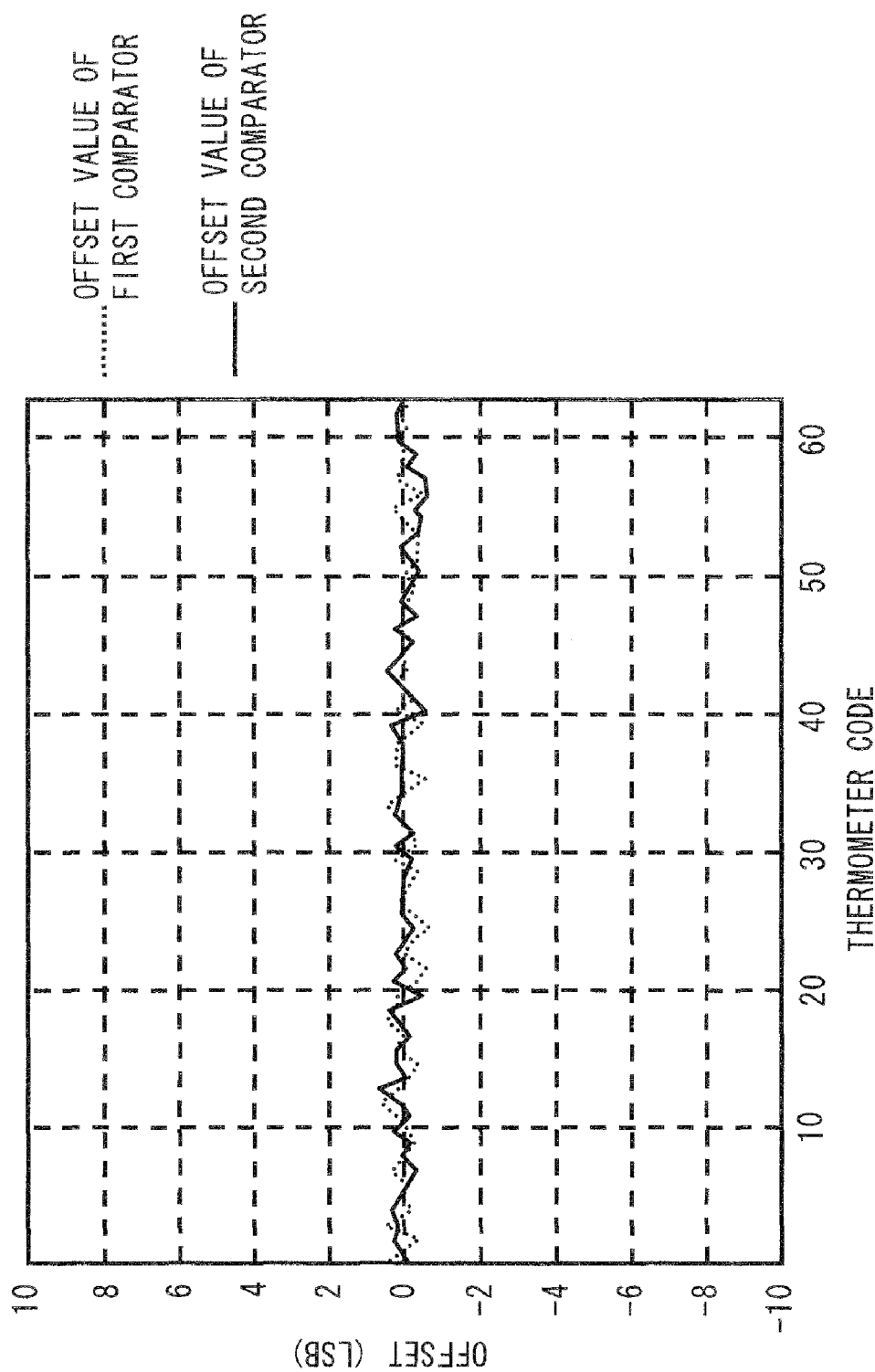
FIG. 10 is a graph showing a state after calibration processing of linearity of the analog-to-digital converter according to the first exemplary embodiment.

FIGS. 9 and 10 are graphs showing examples of improvement effects of the linearity in the analog-to-digital converter 1. In FIGS. 9 and 10, the horizontal axis indicates the value of the thermometer code, and the vertical axis indicates the offset value. FIG. 9 shows the initial state of the conversion accuracy in the analog-to-digital converter 1. FIG. 10 shows the state after performing 100,000 times of calibration cycles. As shown in FIG. 9, the analog-to-digital converter 1 has the offset of about 10LSB at maximum in the initial state. On the other hand, after performing the calibration processing, the analog-to-digital converter 1 has the offset of 1LSB or less with any value of the thermometer code as shown in FIG. 10. In the case of not performing the switching of the configuration of the converter by the barrel shift networks, a difference between the offset value of the first comparators and the offset value of the second comparators shown in FIG. 9 becomes smaller.

Further, because the linearity of the output result is improved by the calibration processing, the accuracy of the comparators forming the converter can be improved in the analog-to-digital converter 1 according to the exemplary embodiment. Comparators with high accuracy generally consume a large power. The analog-to-digital converter 1 ensures the sufficient linearity even with use of comparators with low accuracy, and therefore it allows use of comparators with low power consumption. It is thereby possible in the analog-to-digital converter 1 to achieve high conversion accuracy with low power consumption.

Although the first counters CNTA and the second counters CNTB are attached to the comparators in the above-described exemplary embodiment, the first counters CNTA and the second counters CNTB may be incorporated into the calibrator, and the first adjustment factor OSA and the second adjustment factor OSB may be supplied to the comparators by using the first offset control signal ADJA and the second offset control signal ADJB.

Second Exemplary Embodiment

Figure 11:
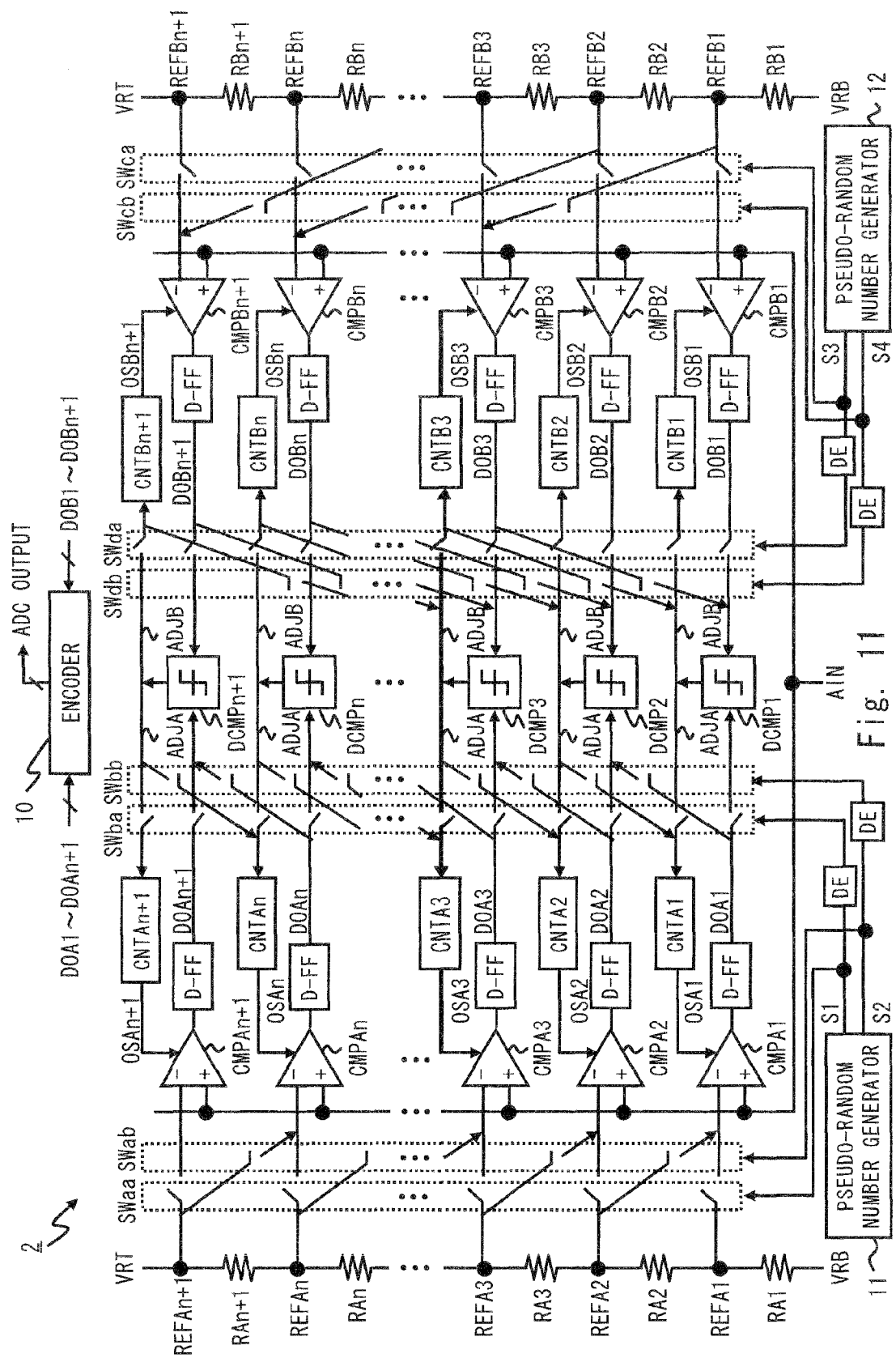
FIG. 11 is a block diagram showing an analog-to-digital converter according to a second exemplary embodiment of the present invention.

FIG. 11 is a block diagram showing an analog-to-digital converter 2 according to a second exemplary embodiment of the present invention. Referring to FIG. 11, in the analog-to-digital converter 2, a third switching circuit (e.g. a third barrel shift network) made up of a switching circuit SWca and a switching circuit SWcb, a fourth switching circuit (e.g. a fourth barrel shift network) made up of a switching circuit SWda and a switching circuit SWdb and a pseudo-random number generator 12 are added to the analog-to-digital converter 1 according to the first exemplary embodiment. In the second exemplary embodiment also, a delay circuit DE is placed between the fourth barrel shift network and the pseudo-random number generator 12.

The third barrel shift network is placed between the reference voltage generator and the second comparators CMPB. The fourth barrel shift network is placed between the second comparators CMPB and the digital comparators DCMP.

The opening and closing of the switching circuit SWca and the switching circuit SWda are controlled by a switch control signal S3. The opening and closing of the switching circuit SWcb and the switching circuit SWdb are controlled by a switch control signal S4. The switch control signals S3 and S4 are output from the pseudo-random number generator 12, and they have logical values that are inverted from each other. The switching circuits SWca and SWda and the switching circuits SWcb and SWdb are thereby controlled exclusively from each other. The switch control signals S3 and S4 are generated by the pseudo-random number generator 12, so that their values randomly change.

The third barrel shift network switches between one comparator and another comparator included in the second comparators CMPB to which one of a plurality of reference voltages is to be supplied. In this exemplary embodiment, the switching circuit SWca is placed between the x-th bit reference voltage value REFBx and the x-th bit second comparator CMPBx. On the other hand, the switching circuit SWcb is placed between the x-th bit reference voltage value REFBx and the x+2th bit second comparator CMPBx+2.

The fourth barrel shift network switches between one second comparator and another second comparator of a plurality of second comparators CMPB which is to be connected to one digital comparator DCMP. In this exemplary embodiment, the switching circuit SWda is placed between the x-th bit second comparator CMPBx and the x-th bit digital comparator DCMPx. On the other hand, the switching circuit SWdb is placed between the x+2th bit second comparator CMPBx+2 and the x-th bit digital comparator DCMPx.

Figure 12:
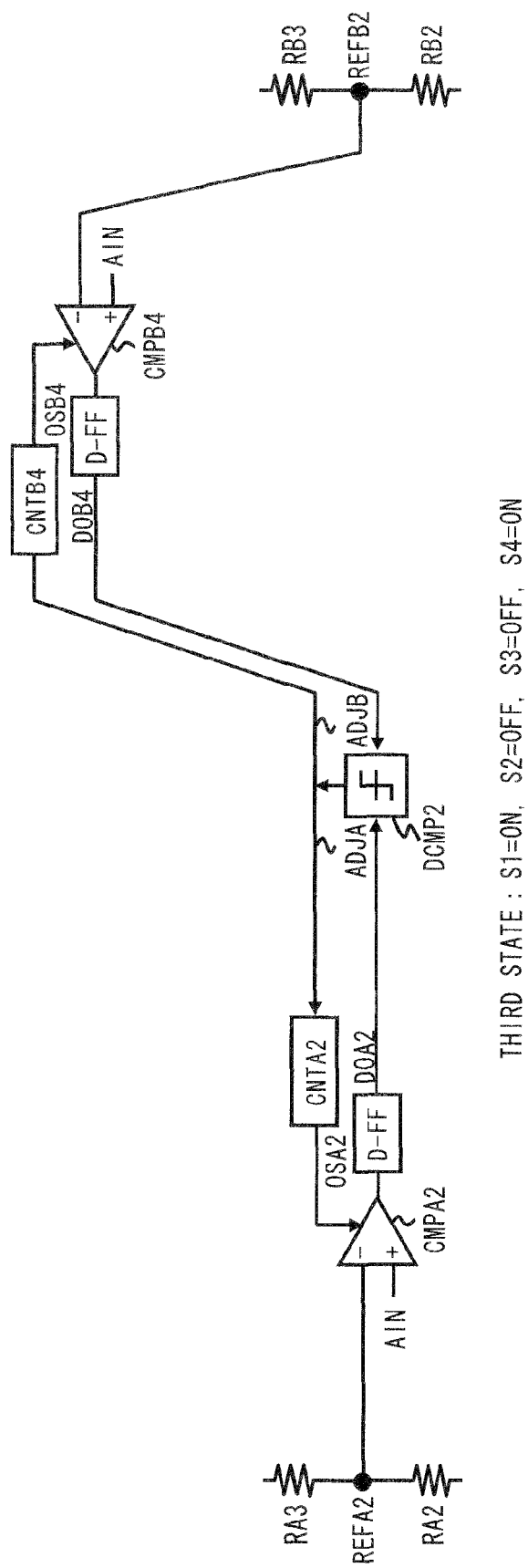
FIG. 12 is a view showing a third state of a configuration pattern of a 1-bit converter in the analog-to-digital converter according to the second exemplary embodiment.
Figure 13:
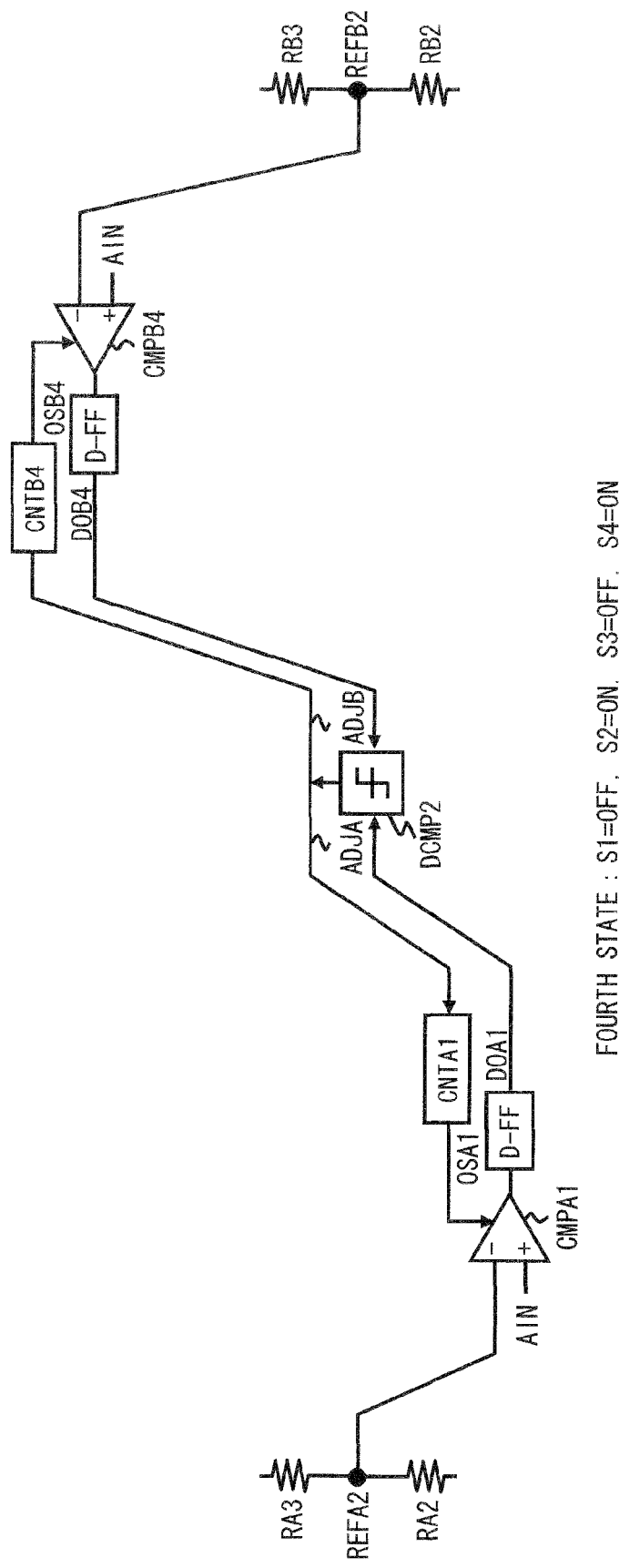
FIG. 13 is a view showing a fourth state of a configuration pattern of a 1-bit converter in the analog-to-digital converter according to the second exemplary embodiment.

With inclusion of the third and fourth barrel shift networks, the analog-to-digital converter 2 according to the second exemplary embodiment can realize a third state shown in FIG. 12 and a fourth state shown in FIG. 13, in addition to the first state shown in FIG. 3 and the second state shown in FIG. 4, as the configuration of the converter. In order to realize the connection pattern of the first state or the second state in the exemplary embodiment, it is necessary that the switch control signal S3 is in the on state and the switch control signal S4 is in the off state.

In the third state shown in FIG. 12, the switch control signal S1 is in the on state, the switch control signal S2 is in the off state, the switch control signal S3 is in the off state, and the switch control signal S4 is in the on state. In the third state, the switching circuits SWaa, SWba, SWcb and SWdb are in the on state, and the switching circuits SWab, SWbb, SWca and SWda are in the off state.

Accordingly, the first comparator CMPA2 and the second comparator CMPB4 are connected to the digital comparator DCMP2. Further, the reference voltage REFA2 is supplied to the inverting terminal of the first comparator CMPA2. The reference voltage REFB2 is supplied to the inverting terminal of the second comparator CMPB4.

Further, in the third state, the first offset control signal ADJA that is output from the digital comparator DCMP2 is supplied to the first counter CNTA2, and the second offset control signal ADJB is supplied to the second counter CNTB4. Then, the first adjustment factor OSA2 is supplied from the first counter CNTA2 to the first comparator CMPA2. The second adjustment factor OSB4 is supplied from the second counter CNTB4 to the second comparator CMPB4.

In the fourth state shown in FIG. 13, the switch control signal S1 is in the off state, the switch control signal S2 is in the on state, the switch control signal S3 is in the off state, and the switch control signal S4 is in the on state. In the fourth state, the switching circuits SWaa, SWba, SWca and SWda are in the off state, and the switching circuits SWab, SWbb, SWcb and SWdb are in the on state. Accordingly, the first comparator CMPA1 and the second comparator CMPB4 are connected to the digital comparator DCMP2. Further, the reference voltage REFA2 is supplied to the inverting terminal of the first comparator CMPA1. The reference voltage REFB2 is supplied to the inverting terminal of the second comparator CMPB4.

Further, in the fourth state, the first offset control signal ADJA that is output from the digital comparator DCMP2 is supplied to the first counter CNTA1, and the second offset control signal ADJB is supplied to the second counter CNTB4. Then, the first adjustment factor OSA1 is supplied from the first counter CNTA1 to the first comparator CMPA1. The second adjustment factor OSB4 is supplied from the second counter CNTB4 to the second comparator CMPB4.

As described above, the analog-to-digital converter 2 according to the second exemplary embodiment enables switching of not only the connection pattern of the first comparators but also the connection pattern of the second comparators. It is thereby possible to cancel out the offset between a plurality of second comparators as well. The analog-to-digital converter 2 thereby enables further improvement of the linearity of the converter compared to the analog-to-digital converter 1.

Although the configuration of the converter is switchable between two patterns by the first and second barrel shift networks in the first and second exemplary embodiments, more patterns of switching may be implemented by the configuration of the barrel shift networks. For example, a shift value (a value indicating how many bits away the circuit to be connected is) by the barrel shift networks may be in the range of 0 to $2^n-1$ bits in the n-bit converter.

Third Exemplary Embodiment

Figure 14:
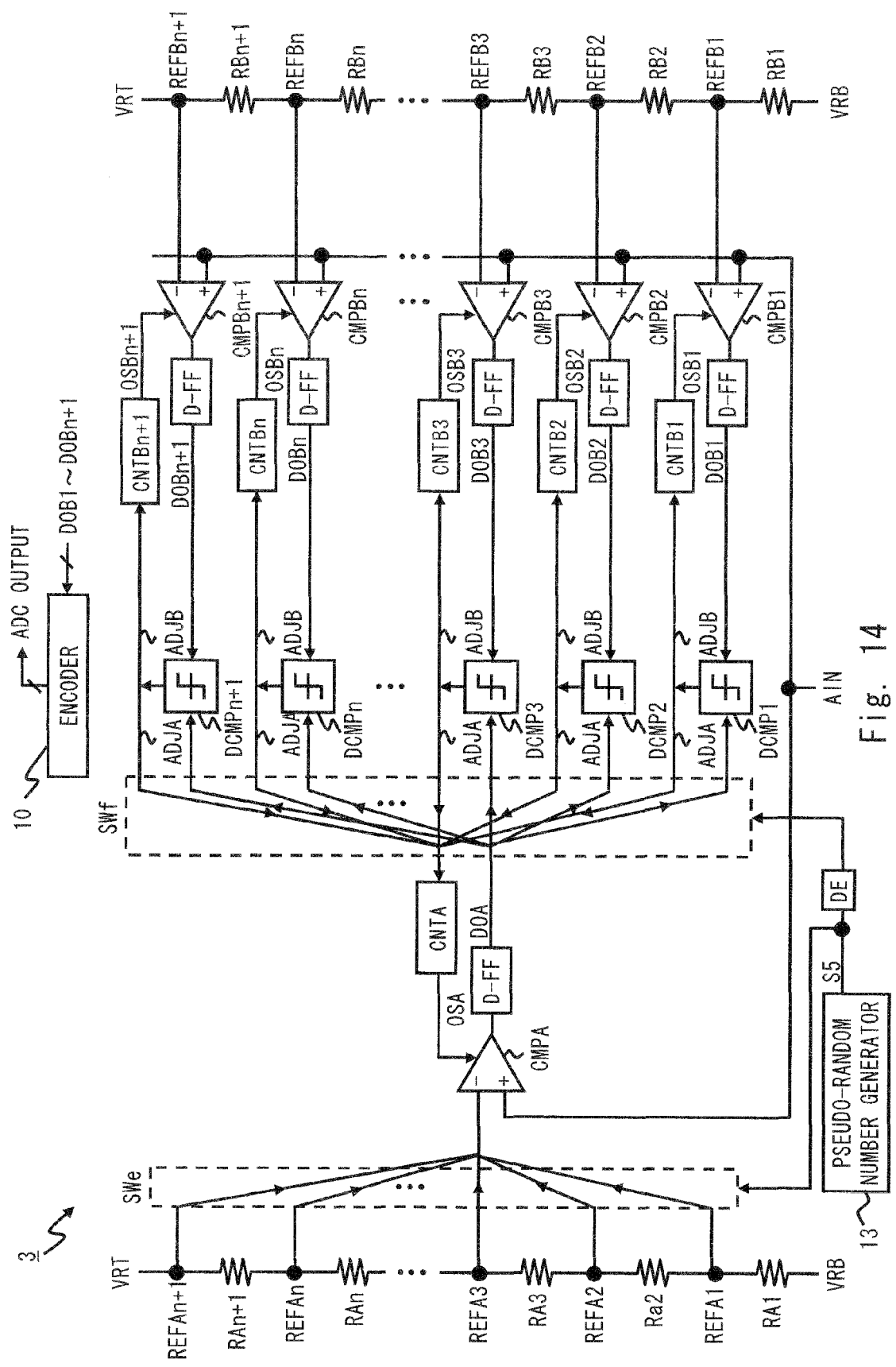
FIG. 14 is a block diagram showing an analog-to-digital converter according to a third exemplary embodiment of the present invention.

FIG. 14 is a block diagram showing an analog-to-digital converter 3 according to a third exemplary embodiment of the present invention. Referring to FIG. 14, the analog-to-digital converter 3 includes one first comparator CMPA, one first counter CNTA, one D-FF, a fifth switching circuit (e.g. a fifth barrel shift network) including a switch circuit SWe, and a sixth switching circuit (e.g. a sixth barrel shift network) including a switch circuit SWf. In the analog-to-digital converter 3, the same elements as those in the analog-to-digital converter 1 are denoted by the same reference symbols and not repeatedly described.

The fifth barrel shift network is placed between the reference voltage generator and the first comparator CMPA. The sixth barrel shift network is placed between the first comparator CMPA and the digital comparators DCMP1 to DCMPn+1.

The opening and closing of the switch circuit SWe and the switch circuit SWf are controlled by a switch control signal S5. The switch control signal S5 is generated by a pseudo-random number generator 13, so that its value randomly changes.

The fifth barrel shift network switches among a plurality of reference voltages which is to be supplied to the first comparator CMPA. The sixth barrel shift network switches among the digital comparators DCMP to which the first comparator CMPA is to be connected.

In the analog-to-digital converter 3, the configuration of the first comparators in the analog-to-digital converter 1 is simplified. Still, the offset of the plurality of second comparators CMPB is cancelled out via the first comparator CMPA. Thus, the effect of improving the linearity of the converter is maintained in the analog-to-digital converter 3 also. Further, in the analog-to-digital converter 3, the circuit size is smaller and the power consumption is lower than in the analog-to-digital converter 1 because the configuration of the first comparators is simplified.

Alternatively, a plurality of first comparators may be used in the analog-to-digital converter 3. For example, the number of first comparators may be any of 1 to $2^n$ in the case of forming an n-bit analog-to-digital converter.

Fourth Exemplary Embodiment

Figure 15:
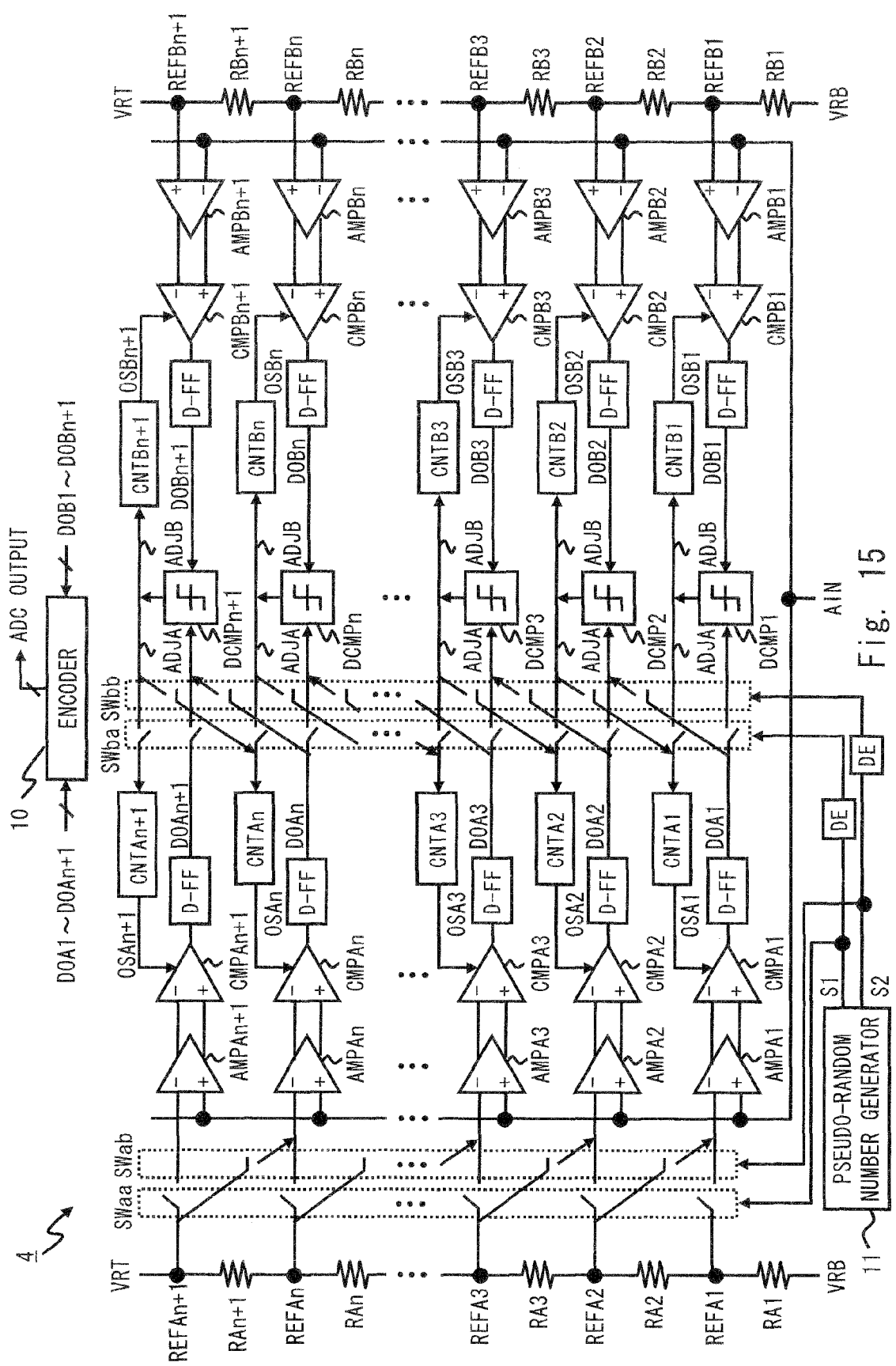
FIG. 15 is a block diagram showing an analog-to-digital converter according to a fourth exemplary embodiment of the present invention.

FIG. 15 is a block diagram showing an analog-to-digital converter 4 according to a fourth exemplary embodiment of the present invention. Referring to FIG. 15, in the analog-to-digital converter 4, preamplifiers AMPA that are placed in the previous stage of the first comparators CMPA and preamplifiers AMPB that are placed in the previous stage of the second comparators CMPB are added to the analog-to-digital converter 1.

The preamplifiers AMPA are placed corresponding to the respective first comparators CMPA. The input signal AIN from the input terminal is input to the non-inverting terminals of the preamplifiers AMPA. Further, the reference voltage REFA is input to the inverting terminals of the preamplifiers AMPA through the switching circuit SWaa or the switching circuit SWab. The preamplifiers AMPA amplify a voltage difference between the reference voltage REFA and the input signal AIN and output a result as a differential signal. The differential signal is input to the non-inverting terminals and the inverting terminals of the first comparators CMPA. Then, the first comparators CMPA compare a voltage between a pair of signals forming the differential signal and output a digital signal.

The preamplifiers AMPB are placed corresponding to the respective second comparators CMPB. The input signal AIN from the input terminal is input to the non-inverting terminals of the preamplifiers AMPB. Further, the reference voltage REFB is input to the inverting terminals of the preamplifiers AMPB. The preamplifiers AMPB amplify a voltage difference between the reference voltage REFB and the input signal AIN and output a result as a differential signal. The differential signal is input to the non-inverting terminals and the inverting terminals of the second comparators CMPB. Then, the second comparators CMPB compare a voltage between a pair of signals forming the differential signal and output a digital signal.

With the preamplifiers placed in the previous stage of the comparators, a voltage difference between the voltage level of the input signal AIN and the reference voltage to be compared by the comparators is amplified. The comparators can thereby compare the voltage level of the input signal AIN and the reference voltage more accurately.

Figure 16:
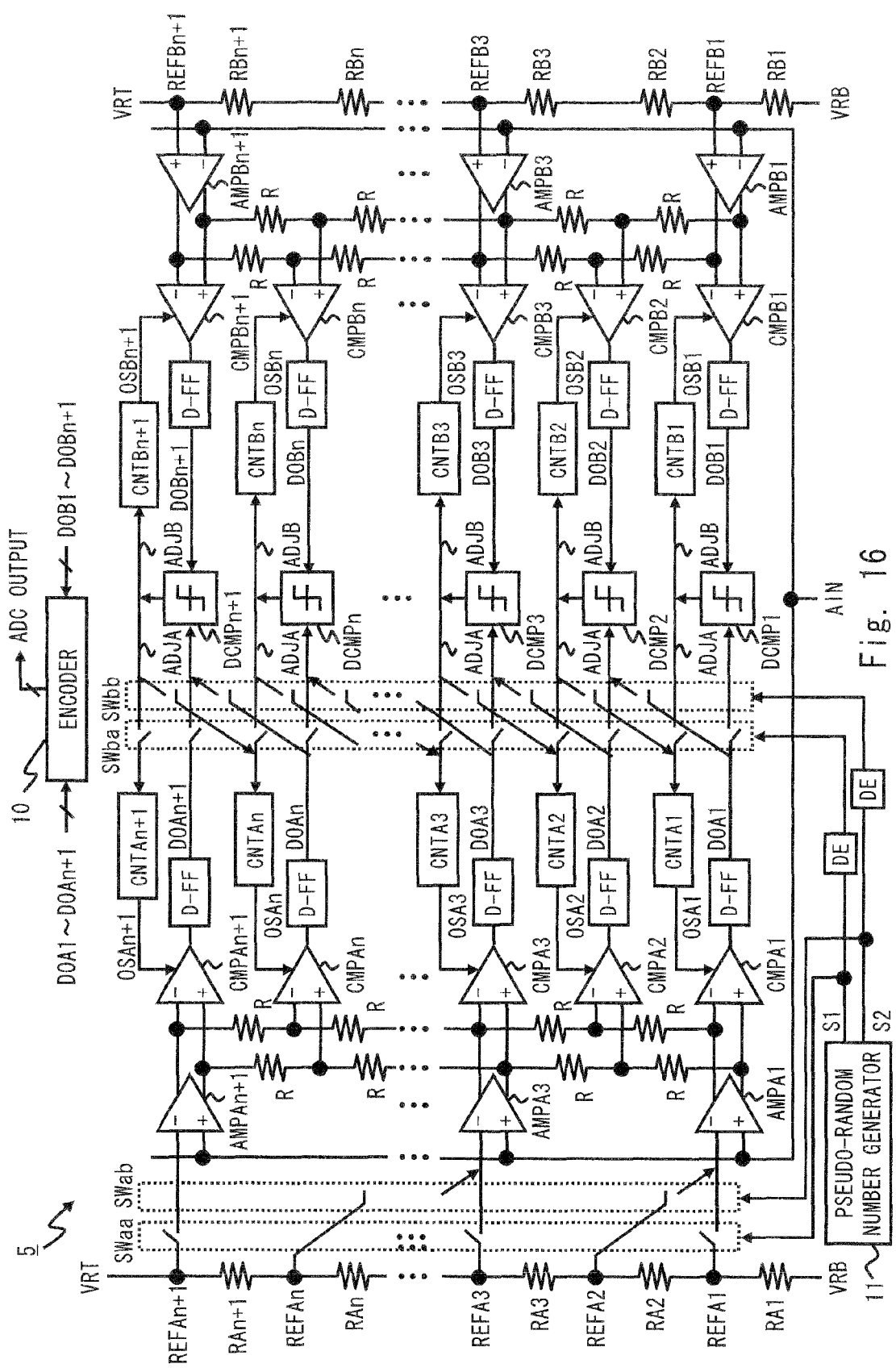
FIG. 16 is a block diagram showing an alternative example of the analog-to-digital converter according to the fourth exemplary embodiment.

It is not necessary that the preamplifiers are placed corresponding to all of the comparators. FIG. 16 is a block diagram of an analog-to-digital converter 5 that implements a circuit that is equivalent to the analog-to-digital converter 4 by using a smaller number of preamplifiers than comparators.

Referring to FIG. 16, in the analog-to-digital converter 5, preamplifiers AMPA are placed corresponding to the comparators for odd number bits. Further, the analog-to-digital converter 5 includes an interpolator in which resistors R are connected in series between the adjacent preamplifiers. The inputs of the comparators for even number bits are connected between the resistors R connected in series. In such a configuration, inputs that are equivalent to the inputs of the comparators for even number bits in the analog-to-digital converter 4 can be supplied to the comparators for even number bits. Further, the circuit size of the analog-to-digital converter 5 is smaller than that of the analog-to-digital converter 4 because the number of preamplifiers is reduced.

Figure 17:
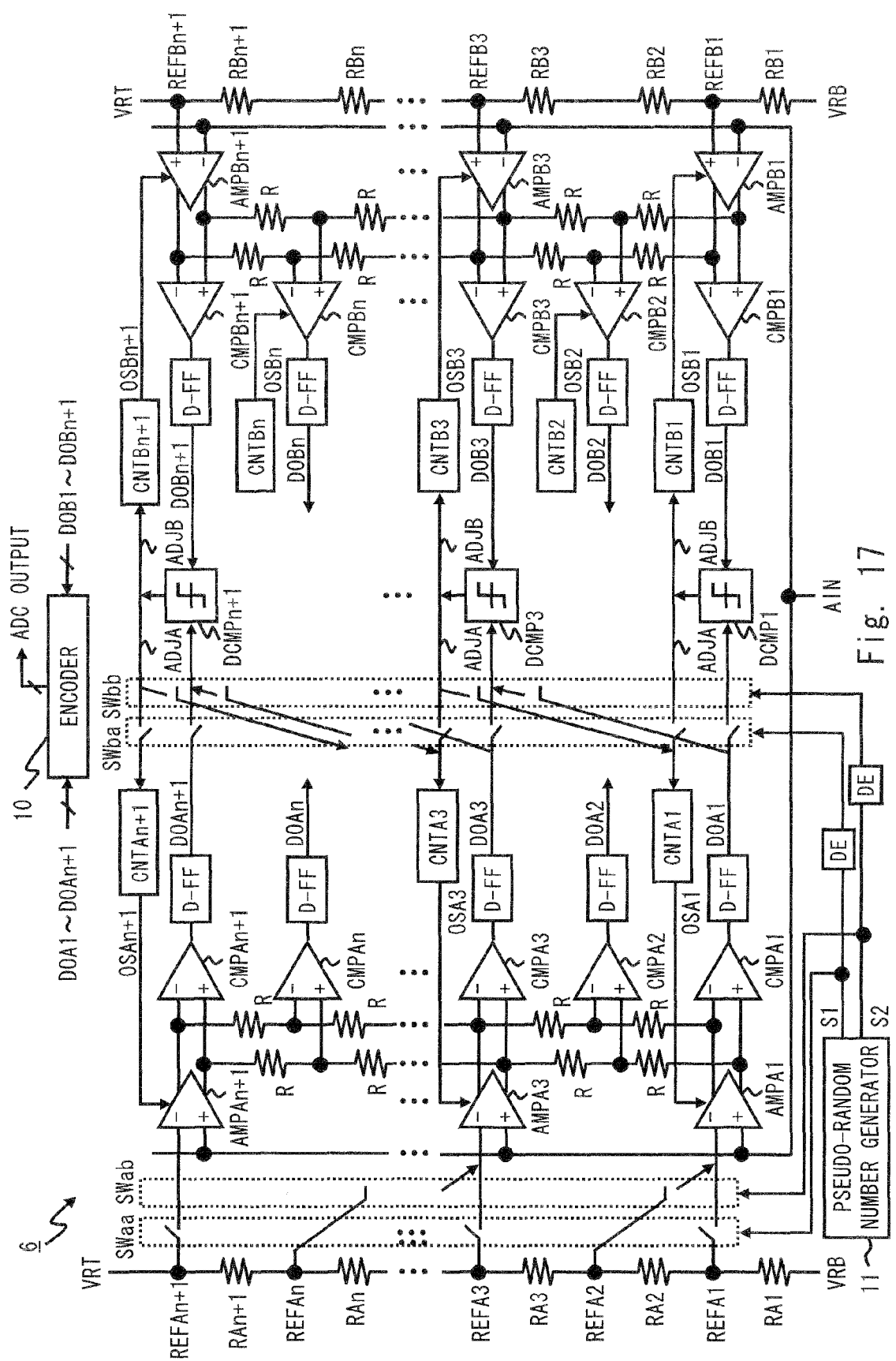
FIG. 17 is a block diagram showing an alternative example of the analog-to-digital converter according to the fourth exemplary embodiment.

FIG. 17 shows an analog-to-digital converter 6 that is an alternative example of the analog-to-digital converter 5 shown in FIG. 16. Referring to FIG. 17, in the analog-to-digital converter 6, the digital comparators DCMP for even number bits are eliminated from the analog-to-digital converter 5. Further, in the analog-to-digital converter 6, the first adjustment factor OSA is supplied to the preamplifiers AMPA, and the second adjustment factor OSB is supplied to the preamplifiers AMPB. Thus, in the analog-to-digital converter 6, the output inversion threshold level of the preamplifiers AMPA and the preamplifiers AMPB is calibrated. By calibrating the output inversion threshold level of the preamplifiers AMPA and the preamplifiers AMPB, the signal level of the input signal can be determined accurately, and therefore the conversion accuracy can be improved in the analog-to-digital converter 6 also. Further, the circuit size of the analog-to-digital converter 6 is smaller than that of the analog-to-digital converter 5. In the analog-to-digital converter 6, it is preferred to optimize the connection state of the second barrel shift network according to the circuit configuration.

Fifth Exemplary Embodiment

Although one analog-to-digital converter is formed with use of two analog-to-digital conversion circuits in the above-described exemplary embodiments, the case of using two analog-to-digital conversion circuits as two analog-to-digital converters is described in the following fifth and sixth exemplary embodiments. Thus, the analog-to-digital converter according to the exemplary embodiments of the present invention uses a plurality of analog-to-digital conversion circuits, and the analog-to-digital conversion circuits formed thereby include those performing conversion processing of two or more channels.

Figure 18:
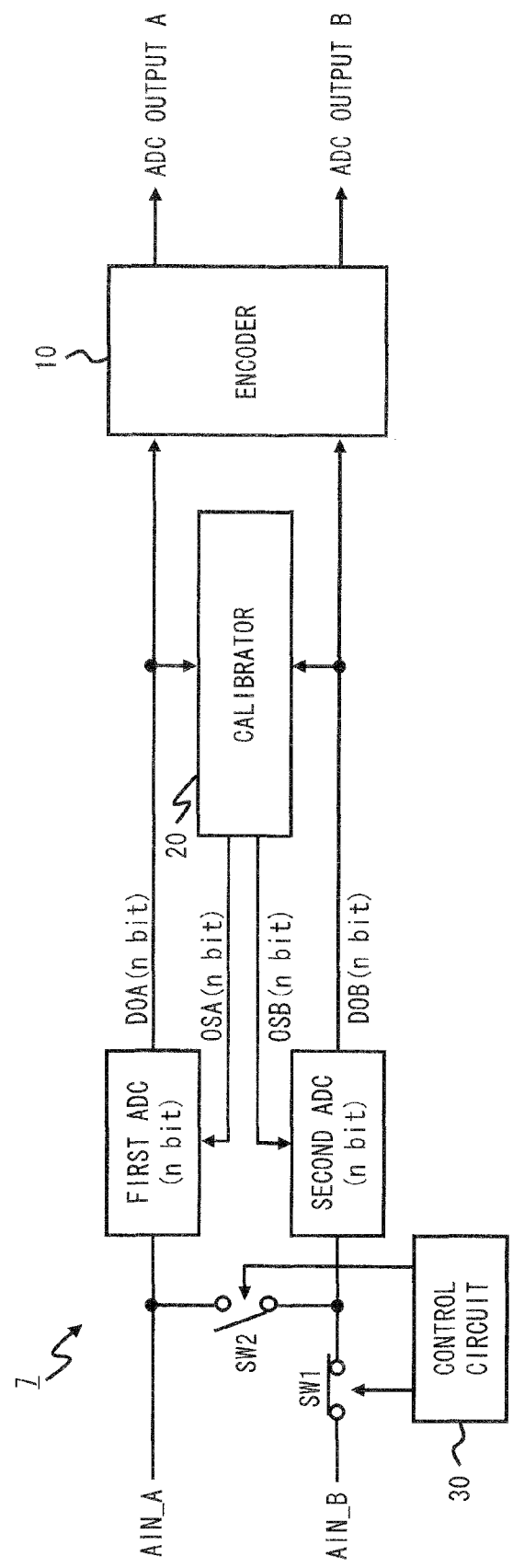
FIG. 18 is a block diagram showing an analog-to-digital converter according to a fifth exemplary embodiment of the present invention.

FIG. 18 is a block diagram showing an analog-to-digital converter 7 according to a fifth exemplary embodiment of the present invention. Referring to FIG. 18, the analog-to-digital converter 7 according to the fifth exemplary embodiment includes a first analog-to-digital conversion circuit, a second analog-to-digital conversion circuit, a calibrator 20 and an encoder 10. The first analog-to-digital conversion circuit, the second analog-to-digital conversion circuit and the calibrator 20 in the analog-to-digital converter 7 are the same as those described in the first, second and fourth exemplary embodiments. The encoder 10 has a structure capable of switching between two ADC outputs and one ADC output according to the operation of the fifth exemplary embodiment. Further, the calibrator 20 stops the calibration operation in the state where the analog-to-digital conversion processing in two channels is performed independently of one another.

In the analog-to-digital converter 7, a first input signal AIN_A is input to the first analog-to-digital conversion circuit through a first path, and a second input signal AIN_B is input to the second analog-to-digital conversion circuit through a second path. The analog-to-digital converter 7 further includes first and second switches (e.g. switching circuits SW1 and SW2) and a control circuit 30.

The switching circuit SW1 is placed on the second path through which the second input signal AIN_B is transmitted to the second analog-to-digital conversion circuit. The switching circuit SW2 is placed in the position connecting the input terminals of the first analog-to-digital conversion circuit and the second analog-to-digital conversion circuit. The control circuit 30 controls the on and off state of the switching circuits SW1 and SW2. In the analog-to-digital converter 7, the calibration operation described in the first, second and fourth exemplary embodiments and the analog-to-digital conversion processing of a plurality of channels by the first and second analog-to-digital conversion circuits are switched by the control circuit 30.

The operation of the control circuit 30 is described in detail hereinafter. Firstly, the operation of the control circuit 30 in a first mode when performing the calibration operation described in the first, second and fourth exemplary embodiments is described. In the first mode, the control circuit 30 turns off the switching circuit SW1 and turns on the switching circuit SW2. Thus, in the first mode, the first input signal AIN_A is input to both of the first and second analog-to-digital conversion circuits. The above-described calibration operation is thereby performed in the first mode.

On the other hand, in a second mode when the first and second analog-to-digital conversion circuits perform the analog-to-digital conversion processing independently of each other, the control circuit 30 turns on the switching circuit SW1 and turns off the switching circuit SW2. Further, in the second mode, the calibrator 20 stops operating, and the encoder 10 outputs two separate conversion results. Thus, in the second mode, the first input signal AIN_A and the second input signal AIN_B are independently input to the first analog-to-digital conversion circuit and the second analog-to-digital conversion circuit, respectively, so that the first analog-to-digital conversion circuit and the second analog-to-digital conversion circuit perform the conversion processing independently of each other.

As described above, the analog-to-digital converter 7 according to the fifth exemplary embodiment can execute the conversion processing of a plurality of channels (two channels in this exemplary embodiment) with use of the first and second analog-to-digital conversion circuits that implement highly accurate conversion processing by the calibration operation in the analog-to-digital converter according to the first, second and fourth exemplary embodiments.

Further, in the case of performing the conversion processing of a plurality of channels by the analog-to-digital converter according to the first, second and fourth exemplary embodiments, it is necessary to place the analog-to-digital converter according to the first, second and fourth exemplary embodiments in each channel. However, because the analog-to-digital converter 7 according to the fifth exemplary embodiment allows independent use of the two converters to be used in the calibration processing, it is not necessary to add the circuit according to an increase in channels. Thus, the analog-to-digital converter 7 according to the fifth exemplary embodiment enables reduction of the circuit size with respect to the number of channels of the analog-to-digital converter by including the switching circuits SW1 and SW2 and the control circuit 30.

Sixth Exemplary Embodiment

Figure 19:
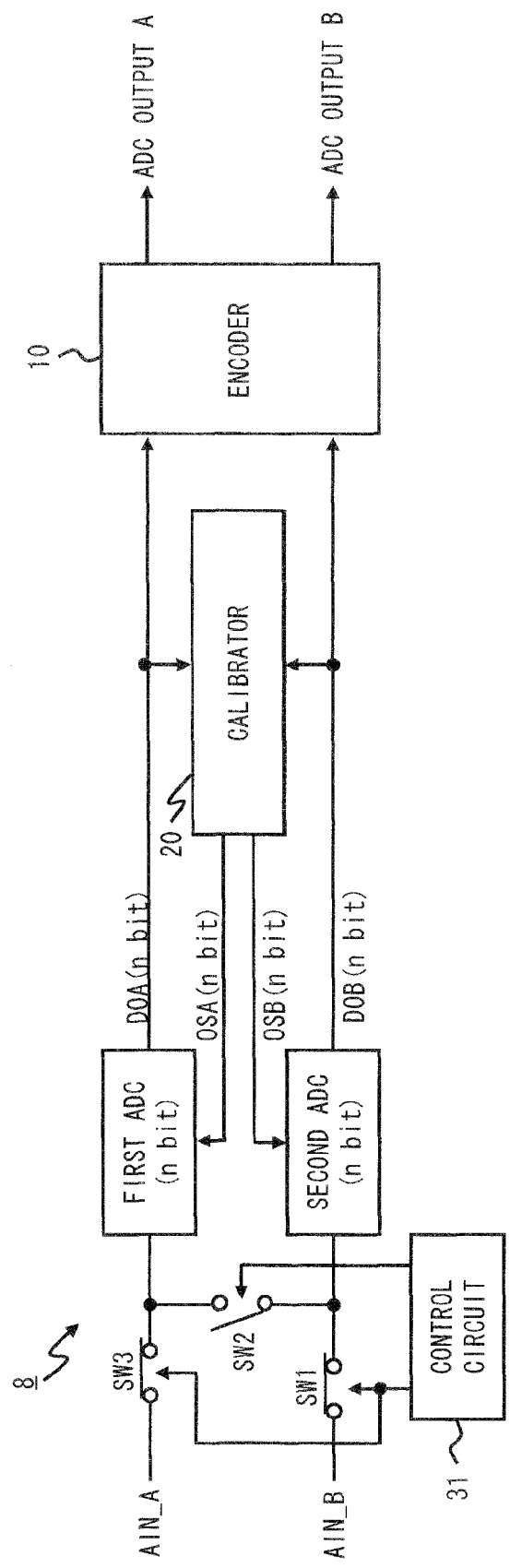
FIG. 19 is a block diagram showing an analog-to-digital converter according to a sixth exemplary embodiment of the present invention.
Figure 20:
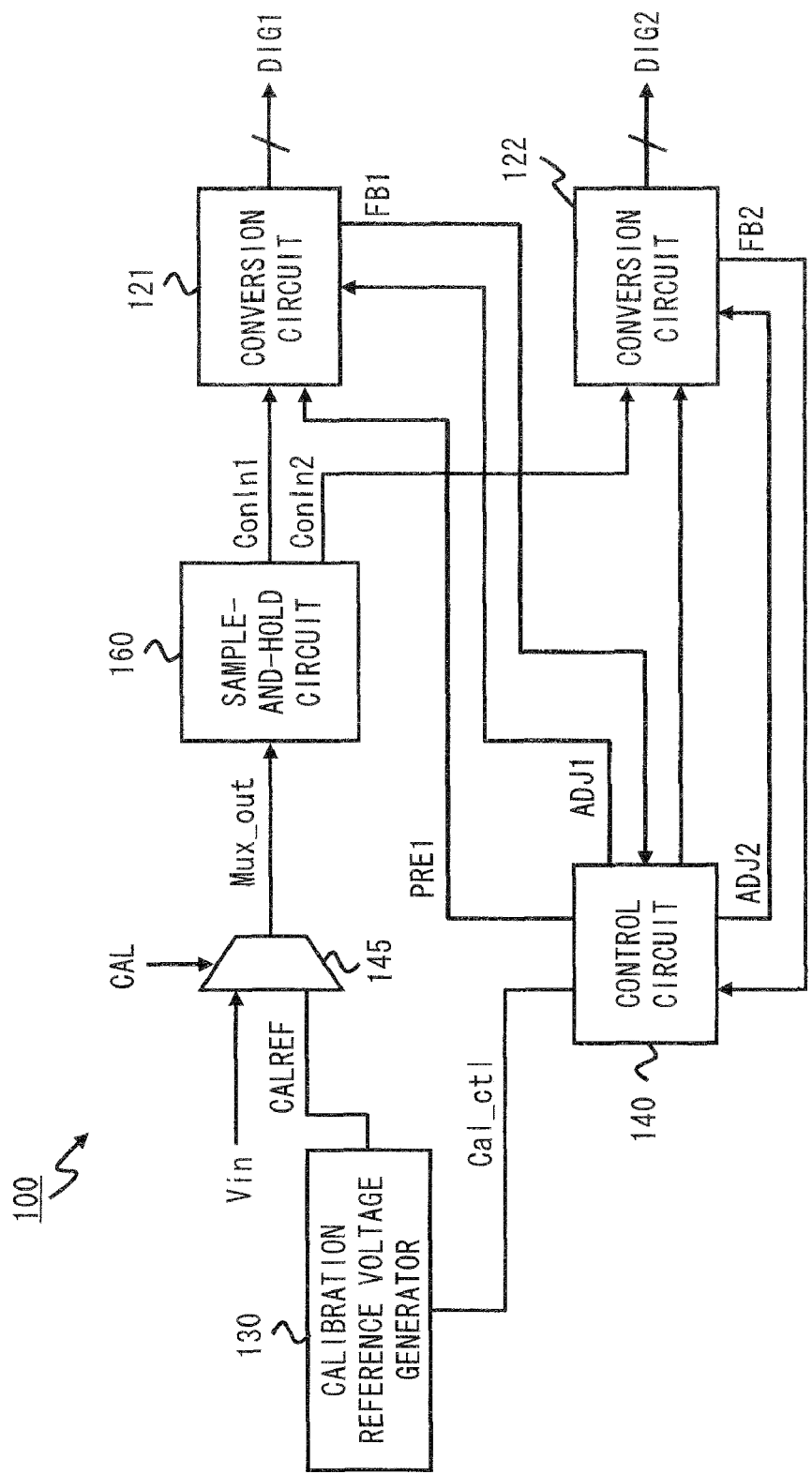
FIG. 20 is a block diagram showing an analog-to-digital converter according to related art.

FIG. 19 is a block diagram showing an analog-to-digital converter 8 according to a sixth exemplary embodiment of the present invention. Referring to FIG. 19, in the analog-to-digital converter 8 according to the sixth exemplary embodiment, a third switch (e.g. a switching circuit SW3) is added to the analog-to-digital converter 7 according to the fifth exemplary embodiment. Further, the analog-to-digital converter 8 includes a control circuit 31 for controlling the switching circuits SW1 to SW3. The switching circuit SW3 is placed on the first path through which the first input signal AIN_A is transmitted to the first analog-to-digital conversion circuit.

The analog-to-digital converter 8 according to the sixth exemplary embodiment has three operation modes. The first operation mode and the second operation mode of the three operation modes correspond to the first operation mode and the second operation mode in the fifth exemplary embodiment. In the first and second operation modes, the switching circuit SW3 is turned on by the control circuit 31. In the third operation mode of the analog-to-digital converter 8, the calibration operation is performed using the second input signal AIN_B. In this case, the control circuit 31 turns on the switching circuit SW1 and the switching circuit SW2, and turns off the switching circuit SW3. As a result, in the third operation mode, the second input signal AIN_B is input to the first and second analog-to-digital conversion circuits, and the first and second analog-to-digital conversion circuits perform the calibration operation based on the second input signal AIN_B.

As described above, in the analog-to-digital converter 8 according to the sixth exemplary embodiment, the function of the analog-to-digital converter 7 according to the fifth exemplary embodiment is extended. In the analog-to-digital converter 8, the flexibility of the input signal to be used in the calibration operation is enhanced compared to the analog-to-digital converter 7.

The present invention is not restricted to the above-described exemplary embodiments, and various changes and modifications may be made without departing from the scope of the invention. For example, if the input signal AIN is a differential signal, the comparators or the preamplifiers may be altered to have the structure compatible with the input of the differential signal. Further, although the analog-to-digital conversion circuits described in the first, second and fourth exemplary embodiments are used as the first and second analog-to-digital conversion circuits in the fifth and sixth exemplary embodiments, analog-to-digital conversion circuits that perform the calibration operation with use of a plurality of analog-to-digital conversion circuits may be used. For example, the analog-to-digital conversion circuit that performs such a calibration operation may be an analog-to-digital conversion circuit of a successive approximation type, a cyclic type, or a pipeline type.

The first to sixth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An analog-to-digital converter comprising:
    a reference voltage generator that outputs a reference voltage;
    a first comparator and a second comparator that compare the reference voltage and a voltage of an input signal and output a digital signal having a first logical value or a second logical value; and
    a calibrator that compares an output of the first comparator and an output of the second comparator and outputs a first offset control signal and a second offset control signal, wherein
    the first comparator sets an offset value having a positive or negative polarity to an output inversion threshold level based on the first offset control signal,
    the second comparator sets an offset value having a polarity opposite to the polarity set by the first comparator to an output inversion threshold level based on the second offset control signal,
    the first comparator comprises a first counter that increases or decreases a value of a first adjustment factor to output based on a polarity of the first offset control signal and sets the offset value based on the value of the first adjustment factor, and
    the second comparator comprises a second counter that increases or decreases a value of a second adjustment factor to output based on a polarity of the second offset control signal and sets the offset value based on the value of the second adjustment factor.

2. The analog-to-digital converter according to claim 1, wherein
    the calibrator outputs the first offset control signal and the second offset control signal having different polarities if the output of the first comparator and the output of the second comparator have different logical values and outputs the first offset control signal and the second offset control signal having no polarity if the output of the first comparator and the output of the second comparator have the same logical value, if the first offset control signal has a polarity, the first counter increases or decreases the value of the first adjustment factor according to the polarity, and if the first offset control signal has no polarity, the first counter maintains the value of the first adjustment factor, and if the second offset control signal has a polarity, the second counter increases or decreases the value of the second adjustment factor according to the polarity, and if the second offset control signal has no polarity, the second counter maintains the value of the second adjustment factor.

3. The analog-to-digital converter according to claim 1, wherein
the offset value is adjusted in units of steps having a smaller voltage value than a resolution of the analog-to-digital converter.

4. The analog-to-digital converter according to claim 1, wherein
the first comparator comprises at least two comparators,
the reference voltage generator outputs a plurality of reference voltages having different voltage values, and
the analog-to-digital converter comprises:
a first switching circuit that switches between one of the first comparator and another one of the first comparator to which one of the plurality of reference voltages is to be input; and
a second switching circuit that switches between one of the first comparator and another one of the first comparator which is to be coupled to the second comparator.

5. The analog-to-digital converter according to claim 4, wherein
the first switching circuit and the second switching circuit select the same first comparator based on a first switch control signal.

6. The analog-to-digital converter according to claim 1, wherein
the second comparator comprises at least two comparators, and
the analog-to-digital converter comprises:
a third switching circuit that switches between one of the second comparator and another one of the second comparator to which one of a plurality of reference voltages is to be input; and
a fourth switching circuit that switches between one of the second comparator and another one of the second comparator which is to be coupled to the first comparator.

7. The analog-to-digital converter according to claim 6, wherein
the third switching circuit and the fourth switching circuit select the same second comparator based on a second switch control signal.

8. The analog-to-digital converter according to claim 1, wherein
the calibrator comprises a plurality of calibrators,
the reference voltage generator outputs a plurality of reference voltages having different voltage values, and
the analog-to-digital converter comprises:
a first switching circuit that switches among the plurality of reference voltages which is to be input to the first comparator; and
a second switching circuit that switches among the plurality of calibrators to which the first comparator is to be connected.

9. The analog-to-digital converter according to claim 1, wherein
the first comparator and the second comparator comprise:
a first differential amplifier that amplifies a voltage difference between the reference voltage and the input signal and outputs a differential signal; and
a second differential amplifier that outputs the digital signal according to a polarity of the differential signal, and
the second differential amplifier sets the offset value having a positive or negative polarity to an output inversion threshold level for inverting a logical value of the digital signal based on the first offset control signal or the second offset control signal.

10. The analog-to-digital converter according to claim 1, wherein
the first comparator and the second comparator comprise:
a first differential amplifier that amplifies a voltage difference between the reference voltage and the input signal and outputs a differential signal; and
a second differential amplifier that outputs the digital signal according to a polarity of the differential signal, and
the first differential amplifier sets the offset value having a positive or negative polarity to an output inversion threshold level for inverting a polarity of the differential signal based on the first offset control signal or the second offset control signal.

11. The analog-to-digital converter according to claim 1, comprising:
a first path through which a first input signal is input to the first comparator;
a first switch that is placed on a second path through which a second input signal is input to the second comparator;
a second switch that connects between input terminals of the first comparator and the second comparator; and
a control circuit that controls on and off state of the first switch and the second switch, wherein
the control circuit turns off the first switch and turns on the second switch in a first operation mode, and turns on the first switch and turns off the second switch in a second operation mode.

12. The analog-to-digital converter according to claim 11, further comprising:
a third switch that is placed on the first path, wherein
the control circuit turns on the third switch in the first operation mode and the second operation mode, and turns off the third switch and turns on the first switch and the second switch in a third operation mode.

13. An analog-to-digital converter comprising:
an input terminal that inputs an input signal;
a first reference voltage input terminal and a second reference voltage input terminal that input reference voltages having the same voltage value;
a first comparator that compares the reference voltage input from the first reference voltage input terminal and a voltage of the input signal and outputs a digital signal having a first logical value or a second logical value;
a second comparator that compares the reference voltage input from the second reference voltage input terminal and a voltage of the input signal and outputs a digital signal having a first logical value or a second logical value;

a first counter that is placed corresponding to the first comparator;

a second counter that is placed corresponding to the second comparator; and a calibrator that compares an output of the first comparator and an output of the second comparator and outputs a first offset control signal and a second offset control signal having polarities opposite to each other, wherein the first counter increases or decreases a value of a first adjustment factor based on a polarity of the first offset control signal, the first comparator sets an offset value of an output inversion threshold level based on a value of the first adjustment factor, the second counter increases or decreases a value of a second adjustment factor based on a polarity of the second offset control signal, and the second comparator sets an offset value of an output inversion threshold level based on a value of the second adjustment factor.

14. The analog-to-digital converter according to claim 13, wherein the calibrator outputs the first offset control signal and the second offset control signal having no polarity if the output of the first comparator and the output of the second comparator have the same logical value, and the first counter and the second counter maintain the values of the first adjustment factor and the second adjustment factor if the first offset control signal and the second offset control signal have no polarity.

15. The analog-to-digital converter according to claim 13, wherein the offset value is adjusted in units of steps having a smaller voltage value than a resolution of the analog-to-digital converter.

16. The analog-to-digital converter according to claim 13, wherein the first comparator comprises at least two comparators, the reference voltage generator outputs a plurality of reference voltages having different voltage values, and the analog-to-digital converter comprises:

a first switching circuit that switches between one of the first comparator and another one of the first comparator to which one of the plurality of reference voltages is to be input; and a second switching circuit that switches between one of the first comparator and another one of the first comparator which is to be coupled to the second comparator.

17. The analog-to-digital converter according to claim 16, wherein the first switching circuit and the second switching circuit select the same first comparator based on a first switch control signal.

18. The analog-to-digital converter according to claim 13, wherein the second comparator comprises at least two comparators, and the analog-to-digital converter comprises:

a third switching circuit that switches between one of the second comparator and another one of the second comparator to which one of a plurality of reference voltages is to be input; and a fourth switching circuit that switches between one of the second comparator and another one of the second comparator which is to be coupled to the first comparator.

19. The analog-to-digital converter according to claim 18, wherein the third switching circuit and the fourth switching circuit select the same second comparator based on a second switch control signal.

20. The analog-to-digital converter according to claim 13, wherein the calibrator comprises a plurality of calibrators, the reference voltage generator outputs a plurality of reference voltages having different voltage values, and the analog-to-digital converter comprises:

a first switching circuit that switches among the plurality of reference voltages which is to be input to the first comparator; and a second switching circuit that switches among the plurality of calibrators to which the first comparator is to be connected.

21. The analog-to-digital converter according to claim 13, comprising:

a first path through which a first input signal is input to the first comparator;

a first switch that is placed on a second path through which a second input signal is input to the second comparator;

a second switch that connects between input terminals of the first comparator and the second comparator; and a control circuit that controls on and off state of the first switch and the second switch, wherein the control circuit turns off the first switch and turns on the second switch in a first operation mode, and turns on the first switch and turns off the second switch in a second operation mode.

22. The analog-to-digital converter according to claim 21, further comprising:

a third switch that is placed on the first path, wherein the control circuit turns on the third switch in the first operation mode and the second operation mode, and turns off the third switch and turns on the first switch and the second switch in a third operation mode.

* * * * *